United States Patent [19]
Yatsushiro et al.

[11] Patent Number: 5,595,781
[45] Date of Patent: Jan. 21, 1997

[54] VAPOR DEPOSITED FILM, AND A GEOMETRY MEASURING METHOD, PRODUCTION PROCESS CONTROL METHOD, PRODUCTION METHOD, GEOMETRY MEASURING APPARATUS AND PRODUCTION PROCESS CONTROL APPARATUS THEREFOR

[75] Inventors: Tsugio Yatsushiro; Jun Torikai, both of Otsu, Japan

[73] Assignee: Toray Industries, Inc., Tokyo, Japan

[21] Appl. No.: 395,852

[22] Filed: Feb. 28, 1995

[63] Continuation-in-part of PCT/JP94/01006 Jun. 23, 1984.

[30] Foreign Application Priority Data

Jun. 29, 1993 [JP] Japan ................................. 5-158582

[51] Int. Cl.[6] ........................................... G23C 14/00
[52] U.S. Cl. ..................... 427/10; 427/248.1; 118/665; 118/708; 118/712; 118/715
[58] Field of Search ................... 427/10, 248.1; 118/665, 708, 712, 715

[56] References Cited

U.S. PATENT DOCUMENTS 5,230,923  7/1993  Hirokawa ..................... 427/248.1

FOREIGN PATENT DOCUMENTS 63-20476  1/1988  Japan .

*Primary Examiner*—Richard Bueker
*Attorney, Agent, or Firm*—Fish & Richardson, P.C.

[57] ABSTRACT

Methods and apparatuses for measuring and controlling the edge positions of a vapor deposited film, and the positions and widths of vapor deposited zones and margin zones of the film, and also the positions of heavy edges, if any, without requiring a skilled operator, are provided. A vapor deposited film on which vapor deposited zones and margin zones are formed in stripes in the longitudinal direction and alternately in the transversal directly by a margin forming device and a metal evaporator is carried by a film carrier system, while being illuminating with the light emitted from a light source, and the light transmittance distribution of the film in the transversal direction of the film is detected by a line sensor camera, to be used for measuring the edge positions of the film, and the positions and widths of the vapor deposited zones and the margin zones, and also the positions of the heavy edges, and for controlling the margin forming device, the metal evaporator, etc. based on the results of measurement.

13 Claims, 15 Drawing Sheets

| PIXEL NUMBER | 0 | 1 | 2 | 3 | 4 | 5 | ···N··· | 2046 | 2047 |
|---|---|---|---|---|---|---|---|---|---|
| DATA | P0 | P1 | P2 | P3 | P4 | P5 | ···PN··· | P2046 | P2047 |

(P0 TO P2047 ARE INTEGERS OF 0 TO 255)

VAPOR DEPOSITED FILM, AND A GEOMETRY MEASURING METHOD, PRODUCTION PROCESS CONTROL METHOD, PRODUCTION METHOD, GEOMETRY MEASURING APPARATUS AND PRODUCTION PROCESS CONTROL APPARATUS THEREFOR

CROSS REFERENCE TO RELATED APPLICATION

This application is a continuation-in-part application of International Application No. PCT/JP94/01006, filed Jun. 23, 1994.

FIELD OF THE INVENTION

The present invention relates to a vapor deposited strip film with vapor deposited zones and vapor nondeposited zones formed alternately in the transversal direction. The invention further relates to a geometry measuring method, production process control method, production method, geometry measuring apparatus and production process control apparatus for measuring and controlling the positions of the vapor deposited zones and vapor nondeposited zones of the vapor deposited film in the transversal direction, and for producing the vapor deposited film.

BACKGROUND OF THE INVENTION

For producing a vapor deposited film, an evaporating machine as shown in FIG. 16 is used. In the evaporating machine 1, a base film 12 is set on a film unwinder 11 installed in a vacuum chamber 10, and the film 12 is carried through a plurality of rollers of a carrier system 13 and a cooling roller 14, being wound around a winder 15.

While being carried, margin zones are formed on the film 12 as metal vapor nondeposited zones formed continuously in the machine direction at predetermined positions in the transversal direction by a margin forming device 16, and furthermore, has metal vapor deposited zones formed continuously in the machine direction at predetermined positions alternately with said margin zones in the transversal direction by a metal evaporator 17 installed below the cooling roller 14. In FIG. 16, symbol 18 denotes a viewing window, for viewing by operator 20., formed in the vacuum chamber 10, and 19 denotes a vacuum exhaust port formed in the vacuum chamber 10.

As a result, as shown in the cross sectional views in the transversal direction of FIGS. 17 and 18 for example, the film 12 has a vapor deposition pattern formed. In FIG. 17, the film 12 has metal vapor deposited zones 12a and metal vapor non-deposited margin zones 12b formed on it. In FIG. 18, heavy edges 12c, which are thicker in vapor deposited film thickness, are formed on vapor deposited zones 12a, in addition to the vapor deposited zones 12a and the margin zones 12b. The heavy edges 12c allow easier deposition of sprayed metal in the electrode forming step of capacitor production on the vapor deposited film.

Furthermore, the margin zones 12b are formed by masking the positions corresponding to the margin zones 12b when the metal evaporated from the metal evaporator 17 is deposited on the film 12. The masking can be achieved by applying oil or tape to the positions corresponding to the margin zones using the margin forming device 16 before metal deposition.

In this step of vapor deposition, the positions and widths of the vapor deposited zones and vapor nondeposited zones in the transversal direction of the film can vary when the film carrier system or margin forming device faults or when the film is uneven in thickness, and the variation greatly affects the quality of the vapor deposited film. Therefore, in the production of the vapor deposited film, the positions and widths of deposition must conform to specified values.

For this reason, in the conventional technique, the film carrier system 13 and the margin forming device 16 must be sufficiently maintained to keep the positions and widths of the vapor deposited zones and margin zones constant. Moreover, during the step of evaporation, the operator 20 observes the vapor deposited film 12 immediately after vapor deposition through the viewing window 18, and adjusts the film carrier system 13 to keep the film 12 traveling stably and adjusts the margin forming device 16 to maintain the positions and widths of the margin zones at the specified values.

If the heavy edges 12c are to be formed, they must be located at the centers of the vapor deposited zones 12a in the transversal direction of the film since the heavy edges 12c correspond with the electrode forming portions in the production of capacitors.

Hence, in the conventional technique, the relative position of the margin forming device 16 and the metal evaporator 17 to form the heavy edges in the transversal direction of the film are adjusted to keep the centers of the heavy edges 12c in agreement with the centers of the vapor deposited zones 12a held between the margin zones 12b, before metal evaporation. Furthermore, during the step of evaporation, the operator 20 observes the vapor deposited film 12 immediately after evaporation through the viewing window 18, and finely adjusts the margin forming device 16 or the metal evaporator 17 to keep the central positions of the heavy edges 12c in agreement with the central positions of the vapor deposited zones 12a.

In the above conventional technique, since the positions and widths of the margin zones are manually adjusted to conform to the specified values, the system disadvantageously relies on the skill of the operator. In particular, it is not easy to train the operator to make dimensional adjustments based on recognition of slight deviations.

Moreover, if the cause for the deviation in the positions and widths of the margin zones cannot be identified soon, uncontrollable deviation can occur, thereby lowering efficiency to a great extent before a skilled operator can take any effective measure.

In addition, the position adjustment of the heavy edges also requires a high degree of skill to achieve a good result.

For these reasons, the vapor deposited film thus prepared is liable to be unstable in the dimensions and positions of the vapor deposited zones and vapor nondeposited zones. As a result, the capacitors, etc. to which such a vapor deposited film is applied can suffer from dispersed electrostatic capacity or low reliability.

SUMMARY OF THE INVENTION

The present invention has been completed to solve the above problems. An object of the present invention is to provide a geometry measuring method, production process control method, production method, geometry measuring apparatus and production process control apparatus for providing easy production of a vapor deposited film by facilitating measurement of the edge positions of the film, the positions and widths of the vapor deposited zones and the margin zones, and furthermore as required, the positions of heavy edges. Another object of the invention is to control these positions and widths in the step of metal evaporation onto the film without requiring a skilled operator, and also to present a vapor deposited film produced by the production method. The above and other objects and advantages of the invention are achieved by the present invention.

The present invention provides a method for measuring the geometry of a vapor deposited film, comprising the steps of allowing a vapor deposited strip film comprising vapor deposited zones and vapor nondeposited zones formed in stripes in the longitudinal direction and alternately in the transversal direction to travel, while illuminating the vapor deposited film with light; receiving the light transmitted through the vapor deposited film; detecting the light transmittance distribution in the transversal direction of the vapor deposited film from the transmitted light; and determining the edge positions of the vapor deposited film, and the positions and widths of the vapor deposited zones and the vapor nondeposited zones based on the detected light transmittance distribution.

The present invention also provides a method for measuring the geometry of a vapor deposited film, comprising the steps of allowing a vapor deposited strip film with vapor deposited zones, each with a longitudinal ridge, and vapor non-deposited zones formed in stripes in the longitudinal direction and alternately in the transversal direction to travel, while illuminating the vapor deposited film with light; receiving the light transmitted through the vapor deposited film; detecting the light transmittance distribution in the transversal direction of the vapor deposited film from the transmitted light; and determining the edge positions of the vapor deposited film, the positions and widths of the vapor deposited zones and the vapor nondeposited zones, and the positions of the ridges based on the detected light transmittance distribution.

The present invention also provides a method for controlling the production process of a vapor deposited film, comprising the steps of forming vapor deposited zones and vapor nondeposited zones in stripes in the longitudinal direction and alternately in the transversal direction on a traveling strip film while illuminating the vapor deposited film with light; receiving the light transmitted through the vapor deposited film; detecting the light transmittance distribution in the transversal direction of the vapor deposited film from the transmitted light; determining the edge positions of the vapor deposited film, and the positions and widths of the vapor deposited zones and the vapor nondeposited zones based on the detected light transmittance distribution; controlling the film position in the transversal direction corresponding to the determined edge positions; and controlling the positions and widths of the vapor deposited zones and the vapor nondeposited zones corresponding to the determined positions and widths of the vapor deposited zones and the vapor nondeposited zones.

The present invention further provides a method for controlling the production process of a vapor deposited film, comprising the steps of forming vapor deposited zones, each with a longitudinal ridge, and vapor nondeposited zones in stripes in the longitudinal direction and alternately in the transversal direction on a traveling strip film while illuminating the vapor deposited film with light; receiving the light transmitted through the vapor deposited film; detecting the light transmittance distribution in the transversal direction of the vapor deposited film from the transmitted light; determining the edge positions of the vapor deposited film, the positions and widths of the vapor deposited zones and the vapor nondeposited zones, and the positions of the ridges based on the detected light transmittance distribution; controlling the film position in the transversal direction corresponding to the determined edge positions; controlling the positions and widths of the vapor deposited zones and the vapor nondeposited zones corresponding to the determined positions and widths of the vapor deposited zones and the vapor nondeposited zones; and controlling the positions of the ridges corresponding to the determined positions of the ridges.

The present invention also provides an apparatus for measuring the geometry of the deposition zones of a vapor deposited film, comprising a light source for emitting light to a traveling vapor deposited strip film with vapor deposited zones and vapor nondeposited zones formed in stripes in the longitudinal direction and alternately in the transversal direction; a means for receiving the light transmitted through the vapor deposited film; a means for detecting the light transmittance distribution of the vapor deposited film in the transversal direction from the transmitted light; and a means for calculating the edge positions of the vapor deposited film and the positions and widths of the vapor deposited zones and the vapor nondeposited zones based on the detected light transmittance distribution.

The present invention also provides an apparatus for measuring the geometry of the deposition zones of a vapor deposited film, comprising a light source for emitting light to a traveling vapor deposited strip film comprising vapor deposited zones, each with a longitudinal ridge, and vapor nondeposited zones formed in stripes in the longitudinal direction and alternately in the transversal direction; a means for receiving the light transmitted through the vapor deposited film; a means for detecting the light transmittance distribution of the vapor deposited film in the transversal direction from the transmitted light; and a means for calculating the edge positions of the vapor deposited film, the positions and widths of the vapor deposited zones and the vapor nondeposited zones, and the positions of the ridges based on the detected light transmittance distribution.

Furthermore, the present invention provides an apparatus for controlling the production process of a vapor deposited film, comprising a carrier means for allowing a strip film with vapor deposited zones and vapor nondeposited zones formed in stripes in the longitudinal direction and alternately in the transversal direction to travel continuously; a means for forming the vapor deposited zones; a means for forming the vapor nondeposited zones; a light source for emitting light to the film; a means for receiving the light transmitted through the film; a means for detecting the light transmittance distribution of the film in the transversal direction from the transmitted light; a means for calculating the edge positions of the vapor deposited film, and the positions and widths of the vapor deposited zones and the vapor nondeposited zones based on the detected light transmittance distribution; a first control means for controlling the carrier means corresponding to the calculated edge positions; and a second control means for controlling the vapor nondeposited zone forming means corresponding to the calculated positions and widths of the vapor deposited zones and the vapor nondeposited zones.

The present invention also provides an apparatus for controlling the production process of a vapor deposited film, comprising a carrier means for allowing a strip film with vapor deposited zones, each with a longitudinal ridge, and vapor nondeposited zones formed in stripes in the longitudinal direction and alternately in the transversal direction travel continuously; a means for forming the vapor deposited zones; a means for forming the vapor nondeposited zones; a light source for emitting light to the film; a means for receiving the light transmitted through the film; a means for detecting the light transmittance distribution of the film in the transversal direction from the transmitted light; a means for calculating the edge positions of the vapor deposited film, the positions and widths of the vapor deposited zones and the vapor nondeposited zones, and the positions of the ridges based on the detected light transmittance distribution; a first control means for controlling the carrier means corresponding to the calculated edge positions; a second control means for controlling the vapor nondeposited zone forming means corresponding to the calculated positions and widths of the vapor deposited zones and the vapor nondeposited zones; and a third control means for controlling the vapor deposited zone forming means corresponding to the calculated positions of the ridges.

The present invention also provides a method for producing a vapor deposited film, comprising the steps of allowing a film to travel while forming vapor deposited zones and vapor nondeposited zones on the film in stripes in the longitudinal direction of the film and alternately in the transversal direction; detecting the light transmittance distribution of the film in the transversal direction; determining the edge positions of the film, and the positions and widths of the vapor deposited zones and the vapor nondeposited zones based on the detected light transmittance distribution; and controlling the vapor deposited zones and the vapor nondeposited zones at predetermined positions on the film corresponding to the determined edge positions and the determined positions and widths of the vapor deposited zones and the vapor nondeposited zones.

The present invention also provides a vapor deposited film, comprising vapor deposited zones and vapor nondeposited zones in stripes in the longitudinal direction and alternately in the transversal direction at predetermined positions corresponding to edge positions and positions and widths of the vapor deposited zones and the vapor nondeposited zones determined based on light transmittance distribution detected, during deposition while the film travels, in the transversal direction.

In the method for measuring the geometry of a vapor deposited film of the present invention, the vapor deposited film is illuminated with light, and the distribution of light transmittances in the transversal direction of the vapor deposited film is measured. Since the outside of the edges of the film, the vapor deposited zones and the vapor nondeposited zones of the film have different light transmittance, the edge positions of the film, and the positions and widths of the vapor deposited zones and the vapor nondeposited zones, and furthermore, as required, the positions of the heavy edges can be determined from the light transmittance distribution.

In the method for controlling the production process of a vapor deposited film of the present invention, the position of the film in the transversal direction, and the positions and widths of the vapor deposited zones and the vapor nondeposited zones, and as required, the positions of the heavy edges are controlled in correspondence to the edge positions of the film, the positions and widths of the vapor deposited zones and the vapor nondeposited zones, and as required, the positions of the heavy edges, respectively determined as described above.

Therefore, the vapor deposited film of the present invention has the vapor deposited zones and margins formed at desired positions with accurate dimensions irrespective of the skill of the operator, and hence the film has small variations in product quality and is highly reliable.

DETAILED DESCRIPTION OF THE INVENTION

An example of the present invention is described below based on the drawings of FIGS. 1 through 15.

Figure 1:
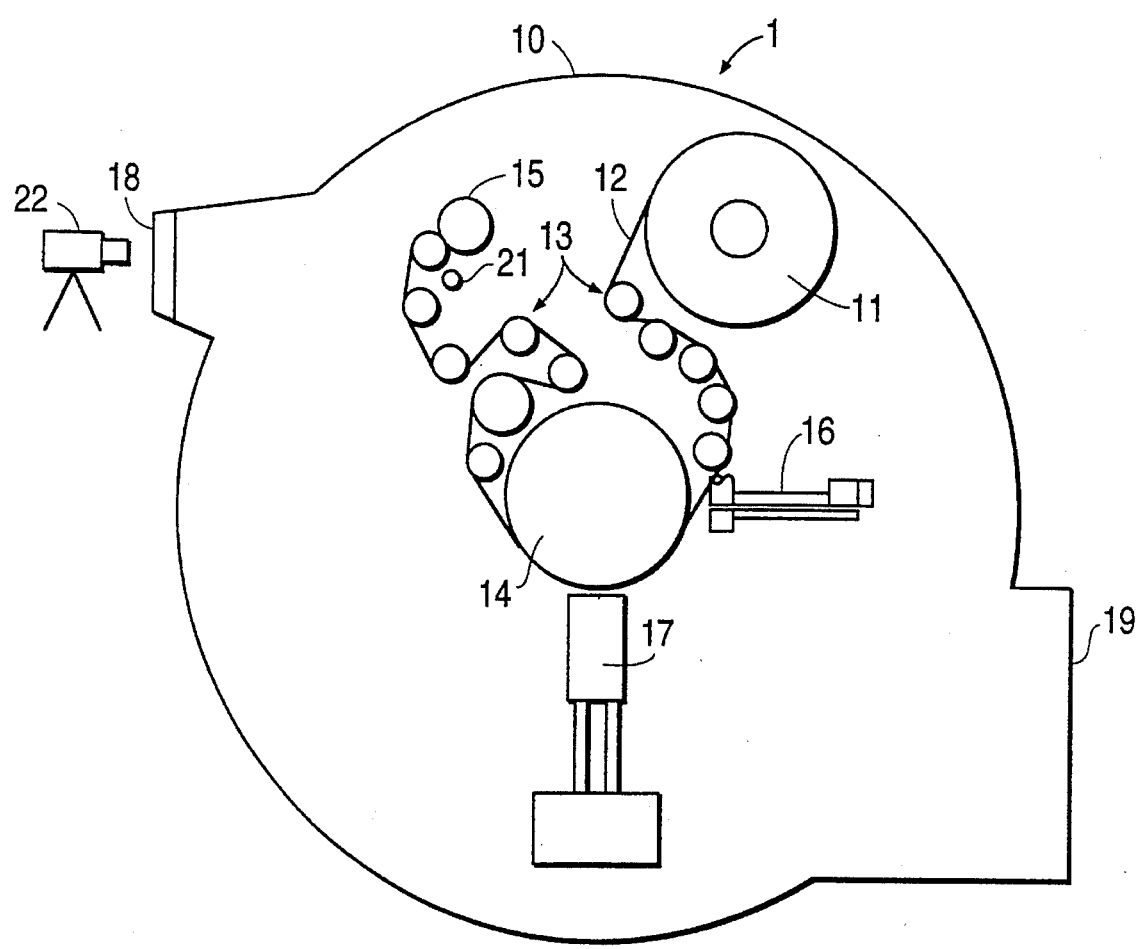
FIG. 1 is a drawing showing the structure of a vapor depositing machine used for producing a vapor deposited film according to the measuring method or control method of the present invention, as an example.
Figure 16:
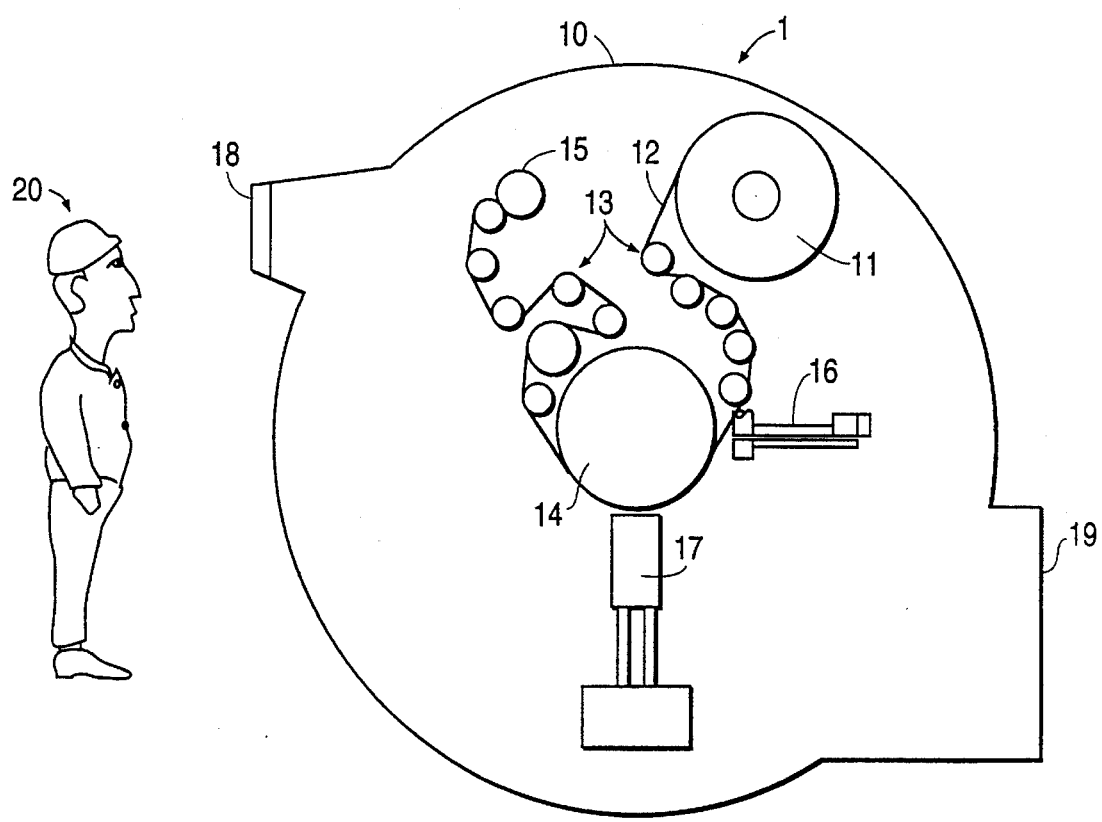
FIG. 16 is a drawing showing a conventional vapor depositing machine.
Figure 17:
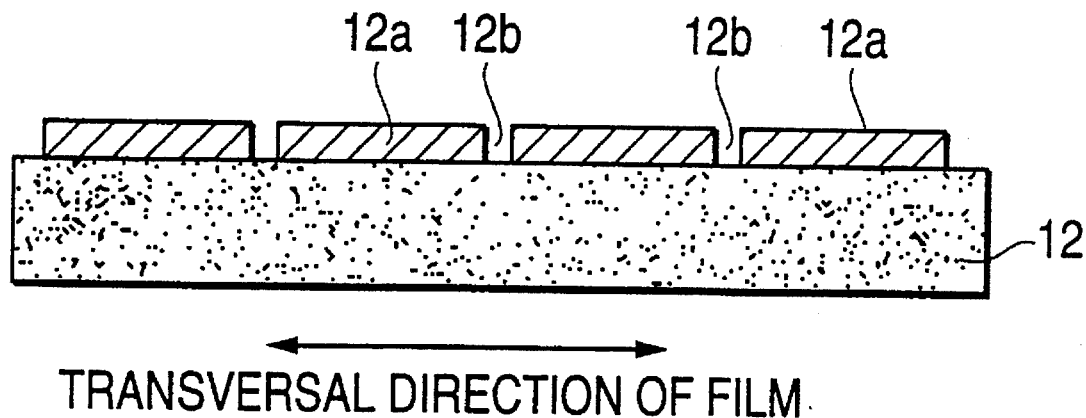
FIG. 17 is a cross sectional view of a vapor deposited film in the transversal direction.
Figure 18:
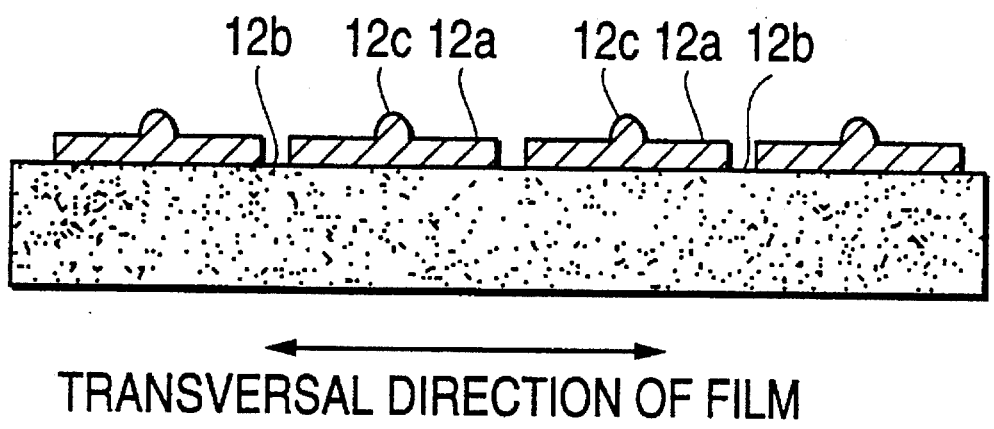
FIG. 18 is a cross sectional view of a vapor deposited film with heavy edges, in the transversal direction.

FIG. 1 is a drawing showing the structure of a vapor depositing machine, as an example, for producing a vapor deposited film using the measuring and control methods of the present invention. The same components as shown in the vapor depositing machine of FIG. 16 are given the same symbols for convenience. Furthermore, in this example, the margin zones are formed by partially applying oil to the film before vapor deposition, and the heavy edges are formed by partially increasing the amount of evaporation from the metal evaporator.

In FIG. 1, the components different from those of the vapor depositing machine shown in FIG. 16 are a light source 21 installed near the predetermined position of the film carrier system 13 in the vacuum chamber 10, and a line sensor camera 22 installed near the viewing window 18 for detecting the light transmitted through the film 12 when the film 12 is illuminated with the light from the light source 21.

As the control apparatus of the vapor depositing machine adopting the measuring and control methods, it is desirable to use an electronic control unit (hereinafter called "ECU") 23 such as a personal computer shown in FIG. 2, for performing the detection of light signals from the light source 21 by the line sensor camera 22, measuring the positions of the film edges 12d, the vapor deposited zones 12a, the margin zones 12b and the heavy edges 12c of the film 12 for every specified length, and for storing the measured values.

In this example, the ECU 23 is connected to the film carrier system 13, the margin forming device 16 and the metal evaporator 17 containing the heavy edge forming device, of the vapor depositing machine 1, respectively through interfaces 24 to 26. Furthermore, the ECU 23 is connected to the line sensor camera 22 through an 8-bit analog/digital (hereinafter called "A/D") converter 27 and an interface 28. The ECU 23 outputs control signals to said respective components 13, 16 and 17 based on the measured values sent from the line sensor camera 22 in order that the film may travel stably, the positions and widths of the vapor deposited zones 12a and the margin zones 12b may conform to the specified values, and the centers of the heavy edges 12c may agree with the centers of the vapor deposited zones 12a. Moreover, the ECU 23 is connected to an encoder 29 through an interface 30, to take in a film length signal from the encoder 29. In addition, the ECU 23 is connected also to a volatile memory 31 and a nonvolatile memory 32. The volatile memory 31 is used for high speed data processing of measured values, and the nonvolatile memory 32 is used for storing data.

The number of pixels (picture elements) of the line sensor camera 22, the focal distance of the lens and the distance between the line sensor camera 22 and the vapor deposited film 12 are not especially limited, and can be selected to suit the measurement field of view and the resolution decided in corresponding to the film width, vapor deposition width and margin width of the vapor deposited film 12 to be measured. It is preferable that the number of pixels of the line sensor camera 22 is 500 or more and that the clock frequency is 1 MHz or more. In this example, the line sensor camera 22 is a camera with CCD elements and outputs data to the ECU 23 through the 8-bit A/D converter 27 and the interface 28, and furthermore has control signals for action applied from the ECU 23 through the interface 28.

This example employs 300 mm as the width W of the film 12 on which a metal vapor is deposited, 2048 as the number of pixels of the CCD elements of the line sensor camera 22, 28.672 mm as the length of the elements, 782.3 atom as the distance between the vapor deposited film 12 and the CCD elements, 409.6 mm as the width of the measurement field of view in the film transversal direction and 0.2 mm in measurement resolution (width of measurement field of view per one pixel). Accordingly, the width of the measurement field of view is about 100 mm wider than the width of the vapor deposited film to be measured, and the position of the line sensor camera 22 is adjusted to let the center of the measurement field of view agree with the center of the vapor deposited film. Therefore, in this example, both the edges of the film are included in the measurement field of view (See FIG. 3).

The above width of the measurement field of view and the measurement resolution are theoretical, and the actual values are usually slightly different from the theoretical values since the focal distance of the lens, the distance between the vapor deposited film 12 and the CCD elements, etc. include errors for the rated values.

Therefore, for highly accurate measurement, the positions and widths of the vapor deposited zones and the vapor nondeposited zones determined by deciding the actual measurement resolution must be calibrated. To accomplish this, a test pattern with stripes known in dimension can be placed at the position of the vapor deposited film 12 for measurement to obtain the number of CCD pixels of the line sensor camera 22 corresponding to the stripe pitch, so that the stripe pitch may be divided by the number of CCD pixels, to decide the accurate measurement resolution.

However, this method requires a test pattern to be placed for setting the measurement resolution, to increase the work volume, and since vapor deposition cannot be performed during the work, productivity cannot be sufficiently enhanced.

Accordingly, the inventors studied the fact that the means for forming the margin zones is mechanically manufactured highly accurately, and devised a method for setting the measurement resolution in-line during production. That is, in the case of an oil margin method, oil is sprayed onto the film from small holes formed at certain intervals in a pipe called a margin nozzle, to form the margin zones. The intervals of the small holes are mostly designed to be the same as those of margin zones predetermined for each type of the vapor deposited films, which are denoted by the "nominal forming intervals of the margin zones." Since the positions or intervals of the small holes are mechanically established highly accurately, the intervals of the margin zones formed on the film remain constant and mostly equal to those of the small holes formed in the margin nozzle even if the relative position between the film and the margin nozzle changes. Therefore, the intervals of the formed margin zones agree with the intervals of the small holes equal to the nominal forming intervals. Furthermore, also in the case of a tape margin method, the intervals of tape support means are accurately determined mechanically. Thus, as in the case of the oil margin method, the intervals of the formed margin zones agree with the intervals of the tape support means equal to the nominal forming intervals. This characteristic of margin zone formation is used to determine accurately the actual measurement resolution from the correlation between the measured intervals of margin zones and the nominal forming intervals of margin zones.

In this example, the light transmittance distribution of the vapor deposited film 12 in the transversal direction is measured at the start of vapor deposition or during production, and the number of CCD pixels of the line sensor camera 22 corresponding to each interval of the margin zones is determined. Then, the known interval of the small holes formed in the margin nozzle is divided by the number of CCD pixels. In this case, with a view to correct for camera installation error, etc., it is preferable to obtain the numbers of CCD pixels of the line sensor camera corresponding to plural intervals of the margin zones rather than obtaining the number of CCD pixels of the line sensor camera 22 corresponding to one interval of margin zones. In this way their mean value is used, and the effect of errors is reduced.

An interval of margin zones is calculated by the interval between the number given to the pixel at which the change from a margin zone to a vapor deposited zone takes place and the number given to the pixel at which the change from the next margin zone to the next vapor deposited zone takes place. More preferably, it is calculated in reference to the central positions of the respective margin zones. The central position is defined as the mean position between the position of the pixel at which the change from a vapor deposited zone to a margin zone takes place and the position of the pixel at which the change from that margin zone to the next vapor deposited zone takes place. In the case of an oil margin method, the margin width may depend on the distance between the margin nozzle and the film, but the central position does not change. Hence, it is preferable to decide the interval of margin zones based on the central positions of the respective margin zones.

Either of the above methods can enhance productivity without requiring the troublesome work of setting a test pattern. Furthermore, even during production, in-line calibration can be effected for contribution also to the security of measurement accuracy.

The transmission light source 21 is preferably be DC lighting or high frequency lighting. In the case of high frequency lighting, the lighting frequency is desirably $(1/T_{int}) \times 10$ or more, where $T_{int}$ is the light signal integrating time of the line sensor camera. If the transmission light source 21 used is constant in the quantity of light in the film transversal direction and all the pixels of the line sensor camera 22 are equal in sensitivity, then the light intensity distribution detected by the line sensor camera 22 can be treated like the light transmittance distribution. If the light source 21 is irregular in light quantity or if the pixels of the line sensor camera 22 are different in sensitivity, correction is necessary. The correction can be effected as follows. If the light intensity detected by each pixel with light directly acquired from the light source 21 without the film 12 is $P_0(n)$ (n is a given pixel number) and the detected intensity of each pixel with the film 12 placed between the light source 21 and the line sensor camera 22 is $P(n)$, then the corrected intensity $P'(n)$ is $P'(n)=k \times P(n)/P_0(n)$, where k is a constant. $P'(n)$ can be treated like the corresponding intensity in the light transmission distribution.

Figure 3:
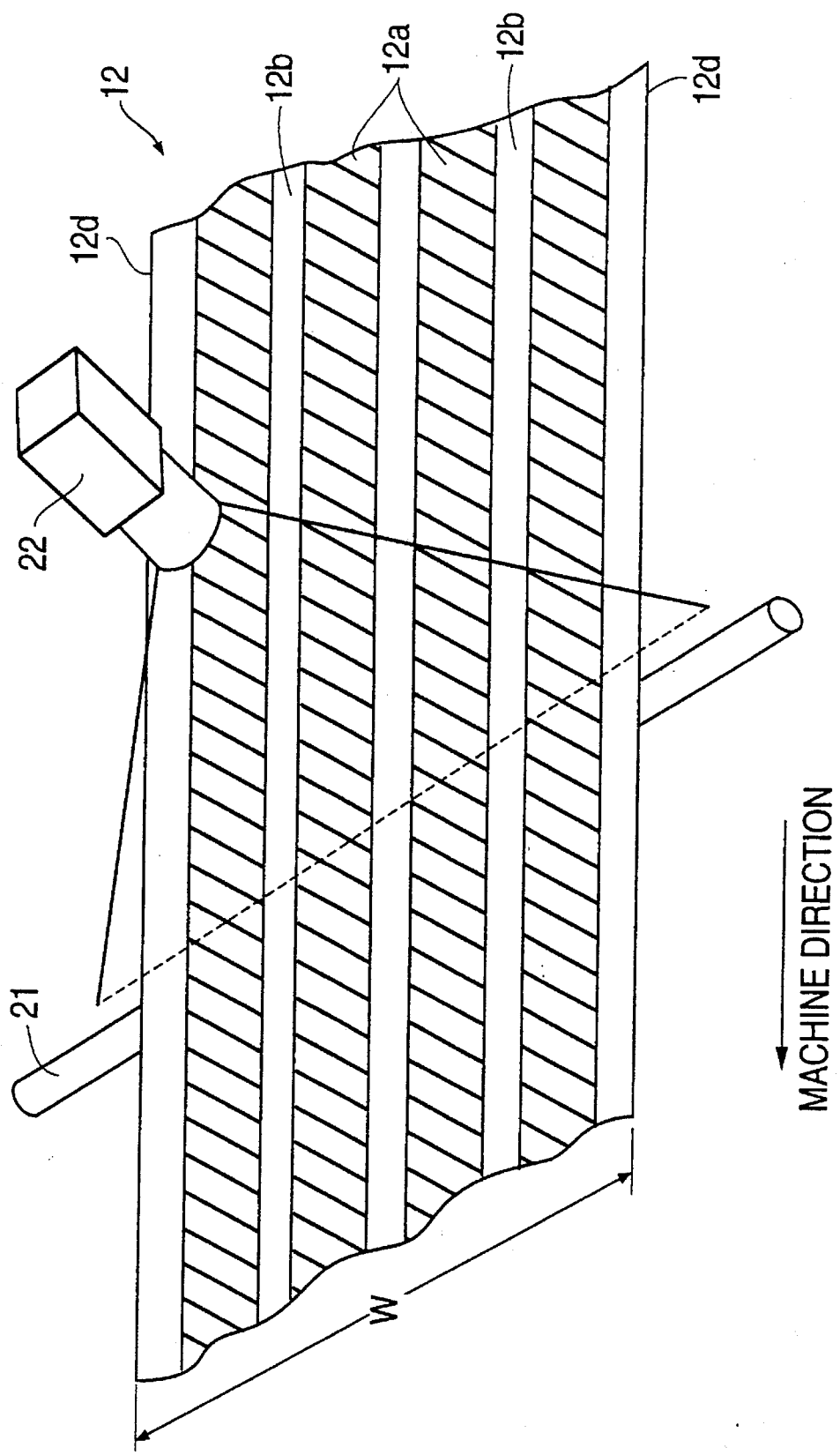
FIG. 3 is a drawing showing the measurement field of view by the line sensor camera shown in FIG. 1.

This example uses, as shown in FIG. 3, a fluorescent lamp of 500 mm in the length of the light emitting portion as the light source 21, and it lights at a high frequency of 30 KHz from 10 mm behind the film face.

When the film edges, the vapor deposited zones and the margin zones are measured using the line sensor camera 22 and the light source 21, the light signal integrating time of the line sensor camera and the opening of the camera lens should preferably be such that the signal detected by the line sensor camera in the absence of the film is from 40 to 100%, more preferably 60 to 90% of the intensity with which the CCD elements of the camera is saturated. Subsequently, if the signal intensity in the absence of the film is $P_b$, the signal intensity of the margin zone is $P_f$ and the signal intensity of the vapor deposited zone is $P_m$, then the threshold level $TH_f$ for detecting the film edges and the threshold level $TH_m$ for detecting the borders between the vapor deposited zones and the margin zones should be set as follows:

$$TH_f = P_f + k_f \times (P_b - P_f) \quad (1)$$

$$TH_m = P_m + k_m \times (P_f - P_m) \quad (2)$$

where $k_f$ and $k_m$ are constants to be set from 0.2 to 0.8, preferably 0.4 to 0.6.

On the other hand, also in the measurement of the heavy edges, the difference in light transmittance between a heavy edge and the portion other than the heavy edge in the vapor deposited zone is used. Also the light transmittance in the portion other than the heavy edge in a vapor deposited zone is smaller than that in a margin zone by a factor of more than tens, and the light transmittance at a heavy edge is further smaller. Therefore, if the opening of the line sensor camera lens and the light signal integrating time are the same as in the above case of measuring the film edges, the vapor deposited zones and the margin zones only, the signals detected by the line sensor camera at heavy edges and in the portions other than the heavy edges in the vapor deposited zones are small. As a result, due to the influence of signal noise, etc., it is difficult to distinguish heavy edges from the portions other than the heavy edges in the vapor deposited zones. Therefore, to allow for discrimination between the heavy edges and the portions other than the heavy edges in the vapor deposited zones, enlarging the signals of the vapor deposited zones detected by the line sensor camera was investigated. As a result, it was found that if the light quantity taken in by the line sensor camera for the measurement of heavy edge positions is smaller by a factor of 5 or less than that for the measurement of film edges, vapor deposited zones and margin zones, the signals of even the portions other than the heavy edges in the vapor deposited zones detected by the line sensor camera are small, and it is difficult to determine accurately the heavy edge positions. On the other hand, if the light quantity taken in by the line sensor camera is larger by a factor of 100 or more, the CCD elements of the line sensor camera may be saturated even at the light intensity at the heavy edges, unpreferably not allowing the heavy edge positions to be determined. As a result, the light quantity taken in by the line sensor camera for the measurement of heavy edges can be preferably set from 5 to 100 times that for measuring the film edges, vapor deposited zones and margin zones.

The light quantity taken in by the line sensor camera can preferably be set from 5 to 100 times by either enlarging the opening of the lens or elongating the light signal integrating time. Compared to enlarging the opening of the lens mechanically, elongating the light signal integrating time does not require any mechanical factor, and is hence advantageous for measuring when the light quantity is changed several times in a short period of time. Therefore, for measurement of heavy edges, the light signal integrating time of the line sensor camera is set preferably from 5 to 100 times that for measuring the film edges, vapor deposited zones and margin zones.

To determine the heavy edge positions from the light transmittance distribution thus detected, a threshold level can be set as in the case of measuring the film edges, vapor deposited zones and margin zones, but if the light transmittances at the centers of the heavy edges are least, the central positions of the heavy edges can be determined from the minimum values in the light transmittance distribution.

In the case where noise in the detected transmittance is significant, the position corresponding to the minimum value may not represent central positions of heavy edges. In such cases, it is preferable to employ the following two methods.

In the first method, the central position is determined by the position which divide the area of each dip of the light transmittance into two equal parts. The total area $S_O$ of a dip is given by the following equation, $$S_o = \sum_{n=i}^{j} (TH_L - P_n), \quad (3)$$

where $P_n$ is signal intensity at a pixel n, $TH_L$ is a threshold, which is lower than the intensity at margin zones, i is the pixel number at which the intensity is firstly lower than $TH_L$, and j is the pixel number (j>i) at which the intensity is firstly higher than $TH_L$. All the intensity at pixels between i and j is lower than the threshold. The center position is obtained, for example, by the pixel number k or k+1 which meets the following equation, $$S_k < \frac{S_o}{2} \leq S_{k+1}, \quad (4)$$

where $S_k$ is defined by the equation;

$$S_k = \sum_{n=i}^{k} (TH_L - P_n). \quad (5)$$

It is preferable to determine the center position by interpolation between k and k+1.

In the second method, the central position is determined by the position corresponding to the center of gravity of each dip of the light transmittance distribution. The center position HC is given by the following equation, $$HC = i + \frac{\sum_{n=i}^{j}(n-i)\cdot(TH_L - P_n)}{\sum_{n=i}^{j}(TH_L - P_n)}. \quad (6)$$

This method is simpler than the first method since the interpolation is included in the above equation.

In this example, the lens opening of the line sensor camera is set at F=5.6, and the light signal integrating time $T_{int}$ of the line sensor camera for detecting the film edges, vapor deposited zones and margin zones is set at 1 msec, while the light signal integrating rime of the line sensor camera for detecting the heavy edge positions is set at 32 msec.

Figure 2:
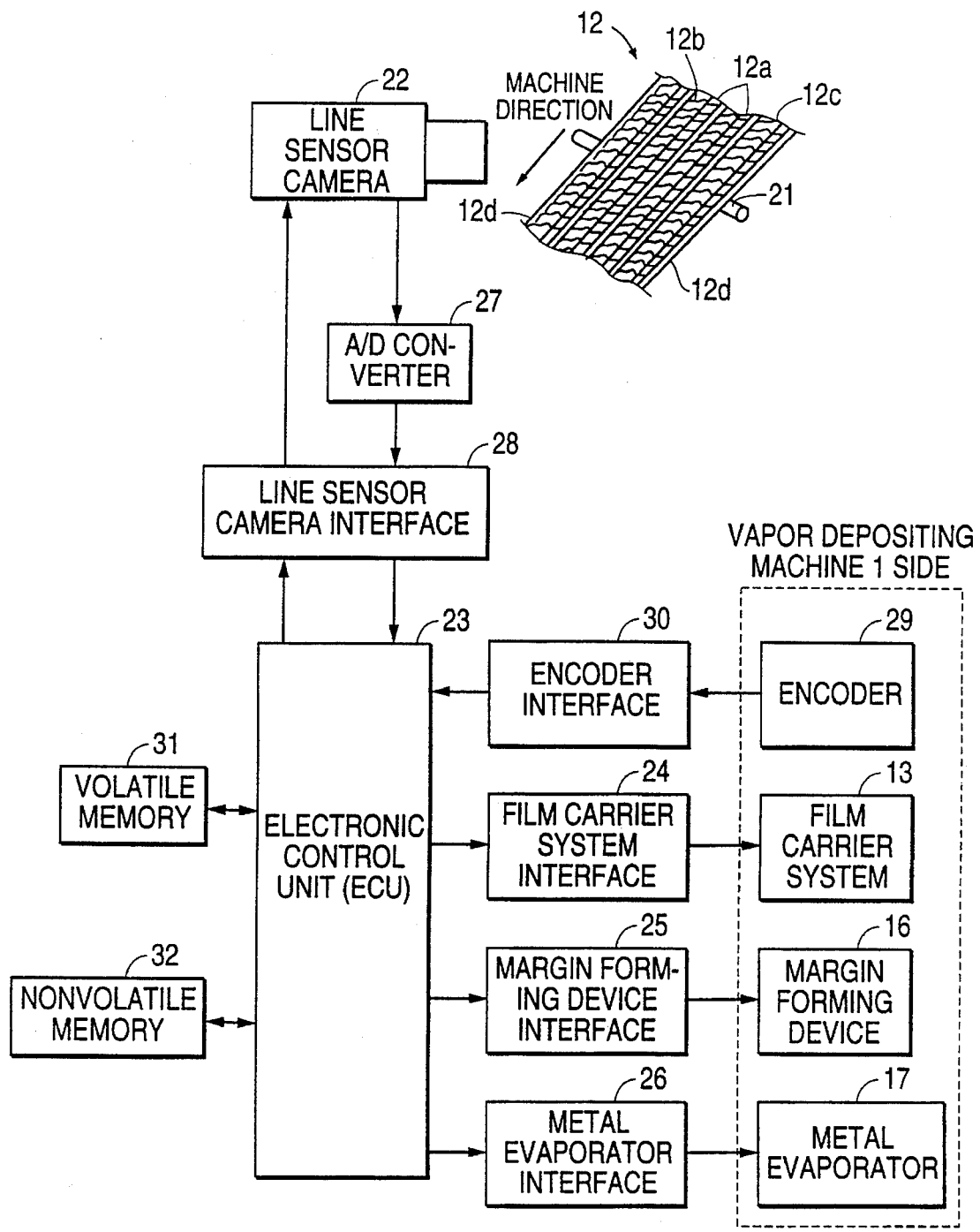
FIG. 2 is a block diagram showing the structure of a control apparatus for the vapor depositing machine shown in FIG. 1.

The action of the control apparatus shown in FIG. 2 is described below with reference to the flow charts of FIGS. 4 to 7.

Figure 4:
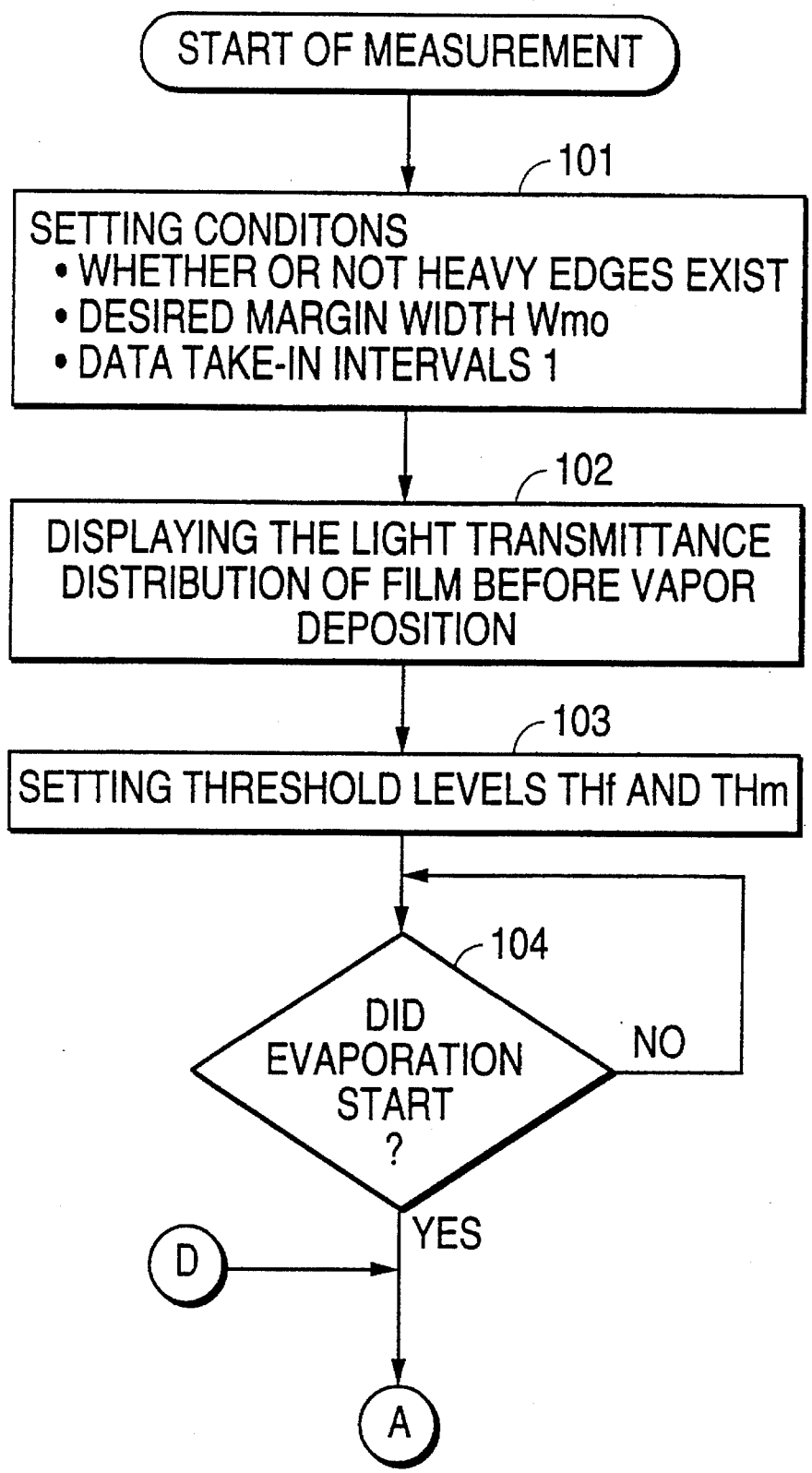
FIG. 4 is a flow chart for illustrating the measurement and control action of the control apparatus shown in FIG. 2.
Figure 5:
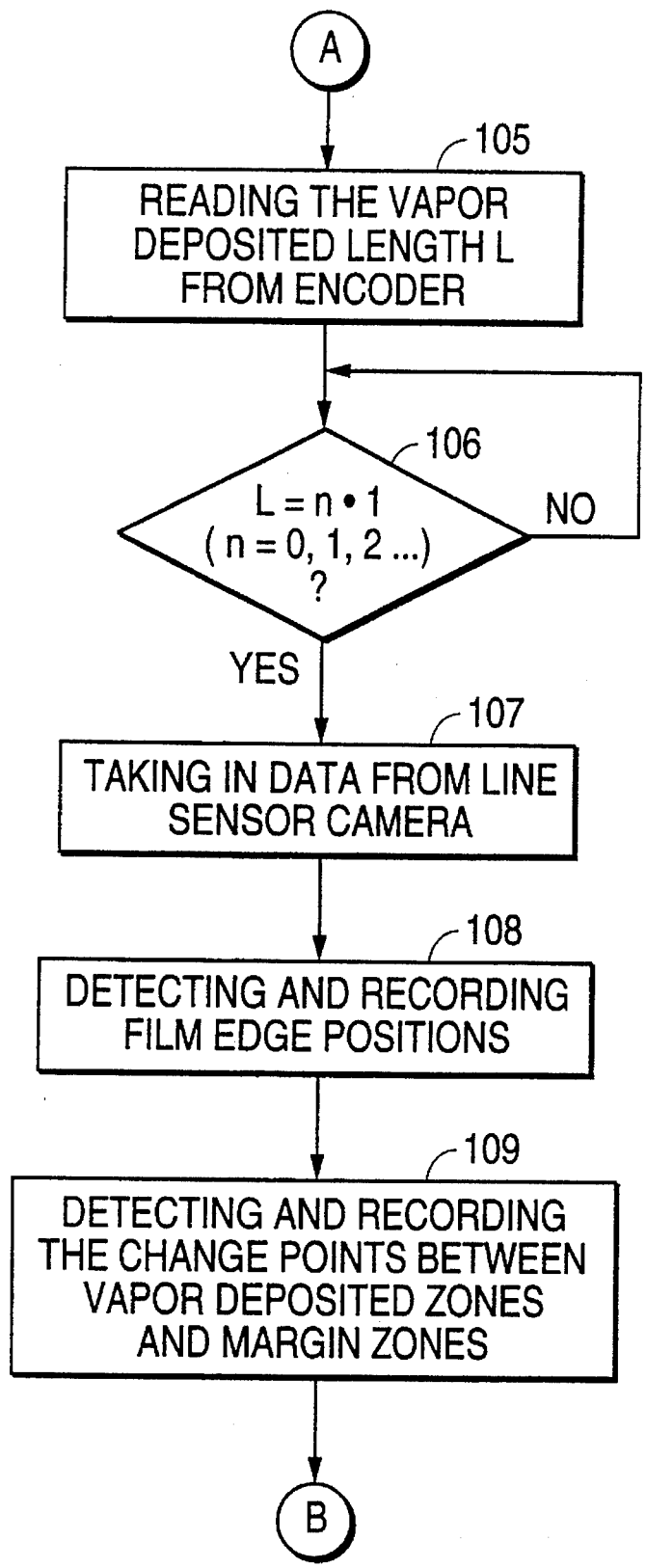
FIG. 5 is a flow chart for illustrating the measurement and control action of the same control apparatus.

At first in FIG. 4, if the operator enters an instruction to start measurement, the program starts, and the ECU 23 asks the operator to enter the conditions required for measurement and control (step 101). The conditions required to be entered include whether there are heavy edges to be measured, the desired margin width $W_{m0}$ and the data take-in intervals I.

Figures 8, 9:
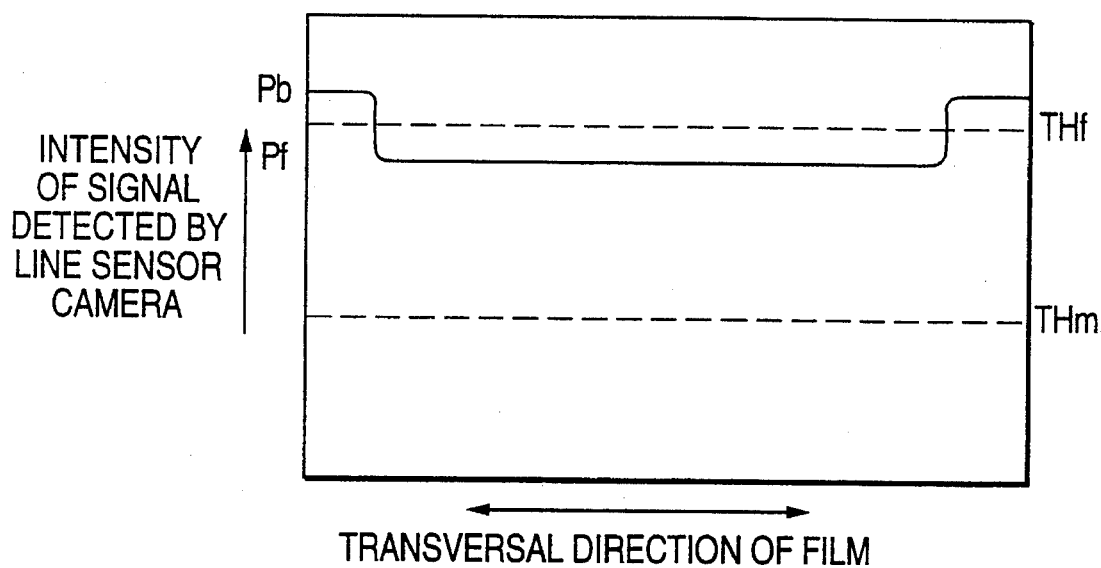
FIG. 8 is a diagram for showing the light transmittance distribution of a base film.
FIG. 9 is a list showing the data measured by the line sensor camera.

If all the conditions in step 101 have been entered, the ECU 23 takes in measured data from the line sensor camera 22 through the A/D converter 27 and the interface 28. Then, the ECU 23 graphs the measured data and provides the graph on a display not illustrated (step 102). When the data are taken in, the measured data form the light transmittance distribution of a base film as shown in FIG. 8 since metal evaporation does not start yet. At this time, the light signal integrating time of the line sensor camera 22 is $T_{int}$=1 msec., and the $P_b$ and $P_f$ levels shown in FIG. 8 correspond to the signal intensity in the absence of the film and the signal intensity of the margin zones as described above.

Subsequently the operator recognizes the graph and sets the threshold level $TH_f$ for detecting the film edges and the threshold level $TH_m$ for detecting the borders between the vapor deposited zones and the margin zones based on formulae (1) and (2) as shown in FIG. 8 (step 103).

The value of $P_m$ in formula (2) cannot be known from FIG. 8, but since $P_m$ is smaller than $P_f$ by more than a factor of tens, the formula (2) can be regarded as $TH_m = k_m \times P_f$ without any problem.

If the threshold levels $TH_f$ and $TH_m$ are set, the ECU 23 recognizes the threshold levels $TH_f$ and $TH_m$, and waits for the start of metal evaporation (step 104). The judgment of evaporation start by the ECU 23 is performed in reference to the signal generated when the shutter to shut off the metal vapor is opened. That is, the time when the shutter is opened to cause the metal vapor to be deposited on the film face is judged as the start of evaporation. If the start of metal evaporation is judged based on the result of calculation, the ECU 23, in FIG. 5, takes in the vapor deposited film length (hereinafter called "vapor deposited length") L from the encoder 29 (step 105), and judges whether the vapor deposited length L is integer times of the data take-in intervals 1 set in step 101 (step 106).

If the vapor deposited length L is not an integer times the take-in intervals 1, the ECU 23 waits till the vapor deposited length L becomes an integer times the take-in intervals 1. If the vapor deposited length L is an integer times the take-in intervals 1, the ECU 23 takes in measured data from the line sensor camera 22 (step 107). In this case, the number of pixels of the line sensor camera 22 is 2048, and the output of the A/D converter 27 is 8 bits. Thus, the measured data are taken in as data of 2048×8 bits by the ECU 23 (See FIG. 9).

Figure 10:
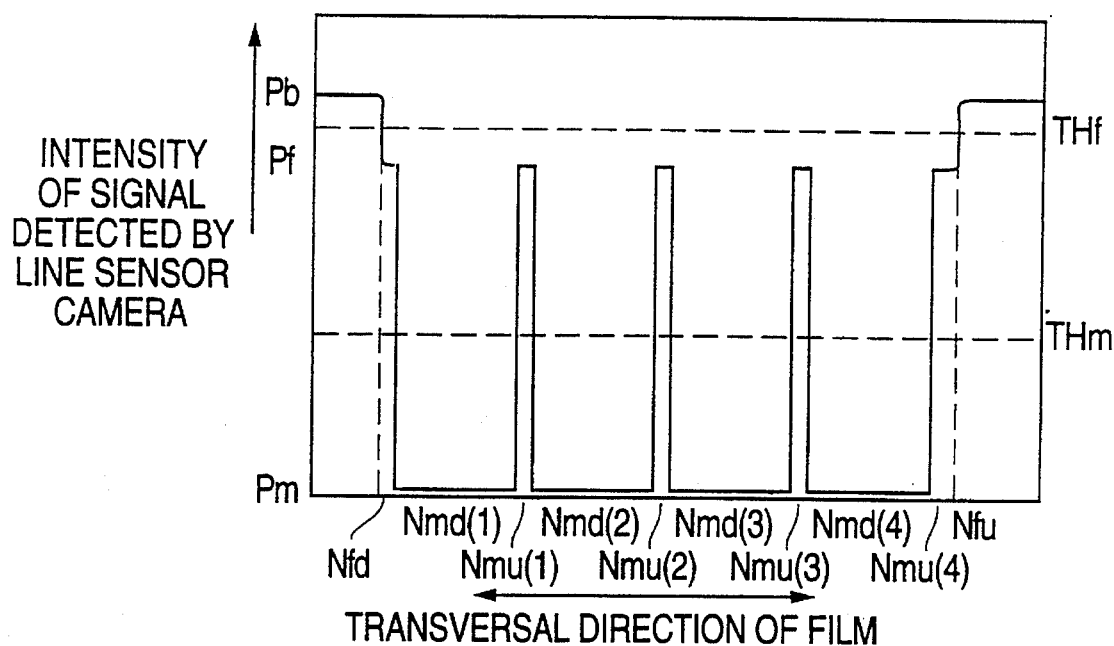
FIG. 10 is a diagram showing the light transmission distribution of a film for detecting the positions of the film edges, the vapor deposited zones and the margin zones.

Subsequently, the ECU 23 examines all the 2048 pixels as to whether the measured value of each pixel is larger or smaller than the threshold level $TH_f$ set in step 103 for detecting the film edges. In this case, the relation between the measured value and $TH_f$ is examined in the order from the smallest pixel number "0" (the left in the field of view) to the largest pixel number "2047" (the right in the field of view). The first pixel number $N_{fd}$ (a pixel number out of 0 to 2047) at which the measured value becomes smaller than $TH_f$ is detected as the left edge of the film, and the first pixel number $N_{fu}$ (a pixel number out of 0 to 2047) at which the measured value becomes larger than $TH_f$ is detected as the right edge of the film, to be stored respectively in the volatile memory 31 (step 108). If the measurement of heavy edges is not set in step 101, the light transmittance distribution of the film obtained by the measured data of the respective picture elements is as shown in FIG. 10, and the positions of the pixel numbers $N_{fd}$ and $N_{fu}$ are as shown in the diagram. That is, FIG. 10 shows a case where the positions of the film edges, vapor deposited zones and margin zones are detected. The actual positions of both the edges of the film (in mm) are obtained by multiplying the measured values of the pixel numbers $N_{fd}$ and $N_{fu}$ by a measurement resolution of 0.2 mm. In the above description, the first pixels at which the measured value becomes smaller or larger than the threshold level $TH_f$ are identified as the positions of the edges, but if the data of the two adjacent pixels which are on both the sides of $TH_f$ are used for interpolation to determine the corresponding edge position, more highly accurate measurement can be effected preferably. The interpolation using the two adjacent pixels should be preferably performed also for detecting the change points between the margin zones and the vapor deposited zones described below.

After detecting the edge positions of the film, the ECU 23 examines all the pixels between $N_{fd}$ and $N_{fu}$ as to whether the measured value of each pixel taken in at step 107 is smaller or larger than the threshold level $TH_m$ for detecting the borders between the vapor deposited zones and the margin zones set at step 103. Also in this case, as in the case of detecting the edge positions of the film, the relationship between the measured value and $TH_m$ is examined in the order from the smallest pixel number to the largest pixel number. The pixel number $N_{md}$ (a pixel number of 0 to 2047) at which the measured data becomes smaller than $TH_m$ is detected as the change point from a margin zone to a vapor deposited zone, and the pixel number $N_{mu}$ (a pixel number of 0 to 2047) at which the measured value becomes larger than $TH_m$ is detected as the change point from a vapor deposited zone to a margin zone, respectively to be recorded in the volatile memory 31 (step 109). When there exist plural vapor deposited zones and plural margin zones in the full width of the film, the pixels of the borders are called $N_{md}(1)$, $N_{mu}(1)$, $N_{md}(2)$, $N_{mu}(2)$, ... $N_{md}(n)$, $N_{mu}(n)$ (n is a given integer), in this order from the smallest pixel number, and recorded in the volatile memory 31. In the case shown in FIG. 10, since there are four vapor deposited zones, there are also four pixels each detected. The actual change point (in mm) between a vapor deposited zone and a margin zone is obtained by multiplying the measured value at the pixel number $N_{md}$ or $N_{mu}$ by a measurement resolution of 0.2 mm.

Figure 6:
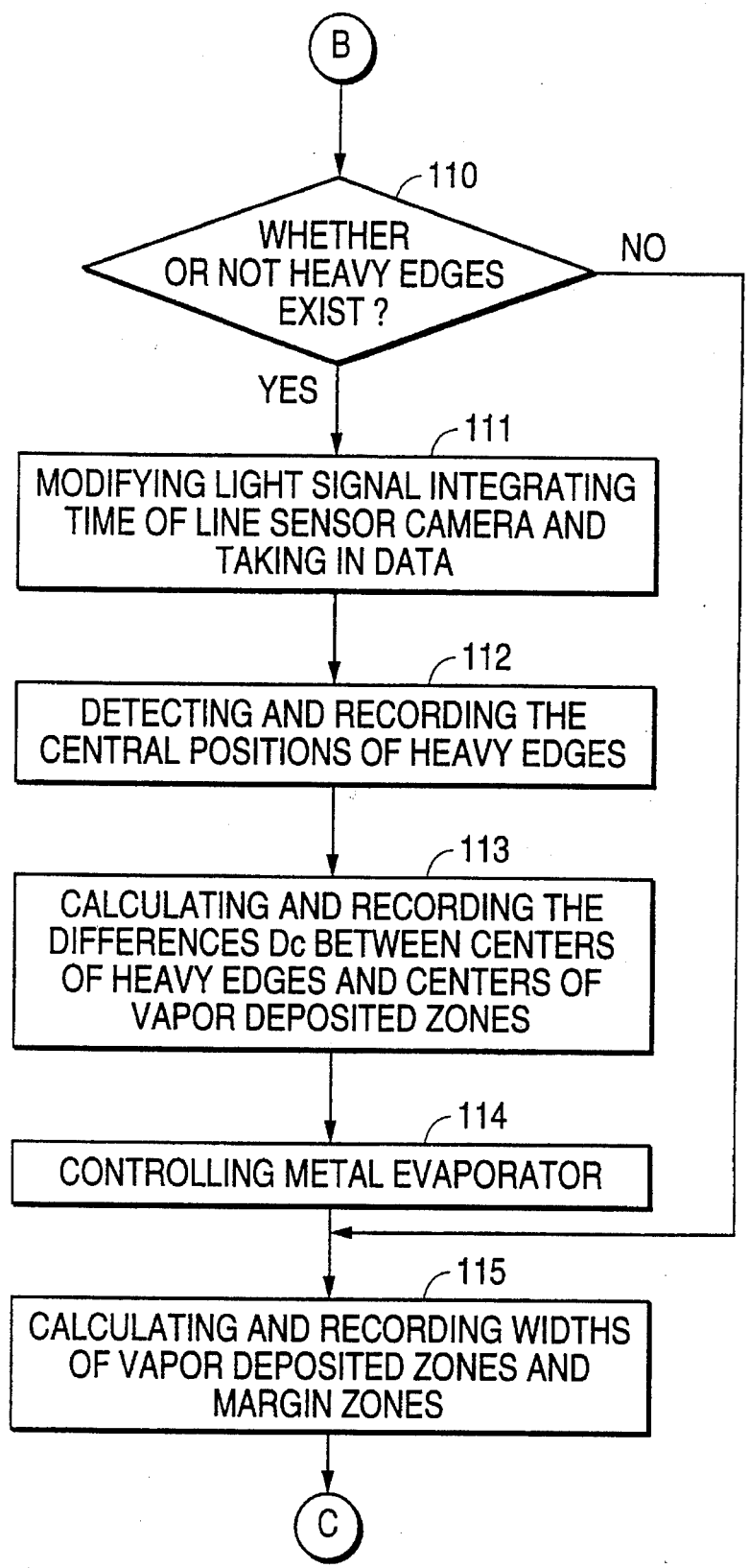
FIG. 6 is a flow chart for illustrating the measurement and control action of the same control apparatus.
Figure 7:
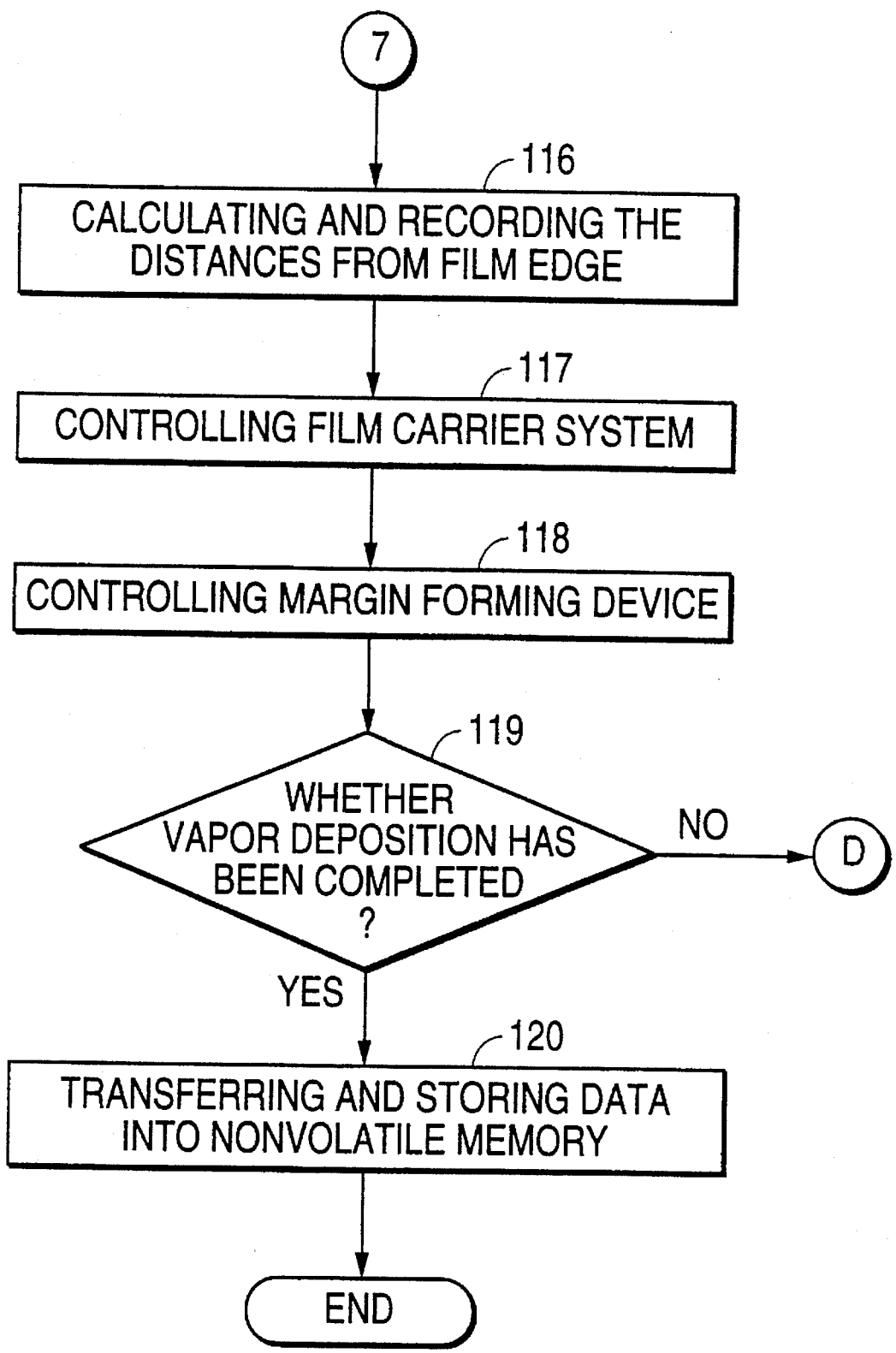
FIG. 7 is a flow chart for illustrating the measurement and control action of the same control apparatus.

Then, in FIG. 6, the ECU 23 judges whether heavy edges exist (step 110). This judgment is based on whether the existence of heavy edges was set at step 101. If, for example, the heavy edges are present, the ECU 23 takes steps in succession from step 111. If heavy edges are not present, the ECU 23 takes steps from step 115, disregarding the steps 111 to 114.

Figure 11:
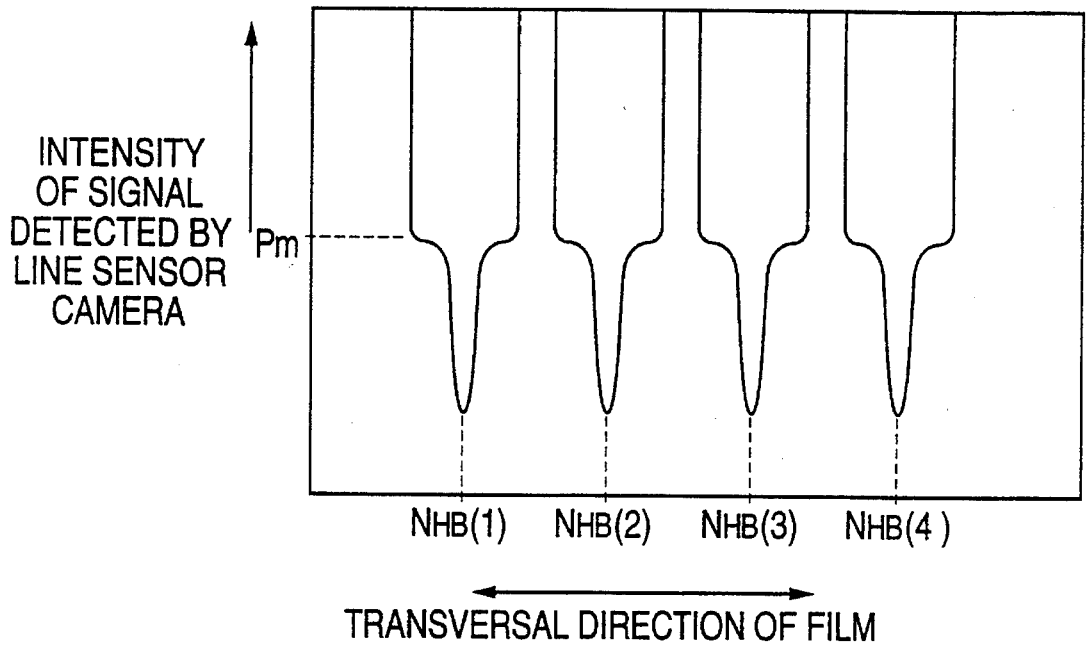
FIG. 11 is a diagram showing the light transmittance distribution of a film for detecting the positions of heavy edges.

That is, if heavy edges are present at step 110, the ECU 23 first, changes the light signal integrating time of the line sensor camera 22 to 32 msec, and subsequently takes in the measured data from the line sensor camera 22 after lapse of 32 msec or more (step 111). The light transmittance distribution obtained from the measured data taken in is, for example, as shown in FIG. 11. The ECU 23 detects the positions of the heavy edges from the distribution. In this case, it is also possible to detect the positions of the heavy edges using a threshold value as in the detection of the film edges, etc.

The detection of heavy edge positions is intended to let the centers of the heavy edges agree with the centers of the vapor deposited zones and to keep the heavy edge thickness distribution and the light transmittance distribution symmetrical in the transversal direction of the film. Therefore, in this example, the pixel numbers $N_{HB}$ (pixel numbers out of 0 to 2047) at the bottoms of the downward peaks shown in FIG. 11 are detected. When there are plural vapor deposited zones in the full width of the film, the plural heavy edges are called $N_{HB}(1)$, $N_{HB}(2)$, ... $N_{HB}(n)$ in this order from the smallest pixel number, and recorded in the volatile memory 31 (step 112). In the case of FIG. 11, since the number of the vapor deposited zones is four, the number of the pixel numbers detected is also four.

Thus, in this example, in the above steps, the positions of the film edges, the positions of the vapor deposited zones and the margin zones (change points between the vapor deposited zones and the margin zones) and the positions of the heavy edges are determined as measured data. The ECU 23 can use the measured data for calculating the difference between the central position of each heavy edge and the central position of the corresponding vapor deposited zone, the distances of the vapor deposited zones and the margin zones from each film edge, and the widths of the vapor deposited zones and the margin zones.

For example, if the leftmost vapor deposited zone is the 1st zone, and the vapor deposited zones located on the right of it are the 2nd to n-th (n is an integer) zones, then the difference $D_c(n)$ in mm between the central position of the heavy edge of the n-th vapor deposited zone and the central position of the n-th vapor deposited zone can be calculated from $D_c(n)=\{N_{HB}(n)-(N_{md}(n)+N_{mu}(n))/2\}\times 0.2$. The ECU 23 records the result of calculation in the volatile memory 31 (step 113).

The ECU 23 outputs a control signal to the metal evaporator 17, to stabilize the result of calculation $D_c(n)$ at "0," for allowing the central position of the heavy edge agree with the central position of the vapor deposited zone (step 114).

The width $W_c(n)$ of the n-th vapor deposited zone in mm can be calculated from $W_c(n)=(N_{mu}(n)-N_{md}(n))\times 0.2$, and the ECU 23 records the result of calculation in the volatile memory 31 (step 115).

Furthermore, the distances in mm from the film edges to the change points between the vapor deposited zones and the margin zones and to the central positions of the heavy edges can be determined by subtracting $N_{fd}$ from the respective measured values of $N_{md}$, $N_{mu}$ and $N_{HB}$ in the case of distances from the left film edge, or subtracting the respective measured values from $N_{fu}$ in the case of distances from the right film edge, and multiplying the differences by 0.2. The results of calculation are recorded in the volatile memory 31 (step 116).

The ECU 23 outputs a control signal to the film carrier system 13 based on the data of the film edge positions detected at step 108 (measured values of pixel numbers $N_{fd}$ and $N_{fu}$), to control the film carrier system 13, for allowing the film travel stably with a certain range without any deviation in the transversal direction (step 117).

Moreover, the ECU 23 outputs a control signal to the margin forming device 16 based on the data of change points between the vapor deposited zones and the margin zones detected at step 109 (measured data of pixel numbers $N_{md}$ and $N_{mu}$) and the width data $W_c(n)$ of the vapor deposited zones obtained at step 115, to control the margin forming device 16 for minimizing the position change of the vapor deposited zones and the margin zones and for stabilizing the widths of the vapor deposited zones and the margin zones at the desired values (step 118). In this example, if the margin forming device 16 uses a margin nozzle of oil margin method, the positions of the vapor deposited zones and the margin zones are controlled by adjusting the margin nozzle in the film transversal direction. Furthermore, the ECU 23 controls the margin forming device 16 to keep constant the distance between the oil spouts of the margin nozzle and the film face for keeping the widths of the vapor deposited zones and the margin zones constant (if the distance between the oil spouts and the film face is larger, the widths of the margin zones become larger).

Subsequently, the ECU 23 judges whether all the vapor deposition has been completed (step 119), and if the vapor deposition is not completed, the ECU 23 returns to step 105, to repeat the above measurement and control for every specified length in the film machine direction. If the vapor deposition has been completed, the ECU 23 transfers the contents (the measured values obtained for every specified length of the vapor deposited film) stored in the volatile memory 31 into the nonvolatile memory 32, to store it there (step 120), for completing its action. The completion of vapor deposition is judged in reference to the signal generated when the shutter of the metal evaporator 17 is closed.

Thus, in this example, since the ECU controls the film carrier system, the margin forming device and the metal evaporator based on the respective measured data detected by the line sensor camera, no skilled operator is required, and the positions of the film edges, the positions and widths of the vapor deposited zones and the margin zones and the positions of the heavy edges can be easily controlled.

The length of the film required for adjusting the positions and widths of the margin zones and the positions of the heavy edges is 990 m on the average in the conventional technique, but is only 510 m on the average in this example. Therefore, in the case of a 32000 m long film, the yield can be enhanced by 1.5% in this example compared to the conventional technique. Furthermore, even though the margin failure rate is 1% in the conventional technique, and it is 0% in this example. Thus, a yield enhancement of 2.5% can be achieved as a whole. Furthermore in this example, since the adjustment in the step of vapor deposition is automatic, the adjustment requires less time, to increase the production accordingly, for further enhancing the yield.

Moreover in this example, since the measured values are stored in the nonvolatile memory, the stored contents can be analyzed to allow process analysis in the step of vapor deposition. Concrete analysis methods include the Fourier transform, statistical processing, etc. of the temporal changes in the positions of film edges, and the positions and widths of the vapor deposited zones and the margin zones. In process analysis, if measurement is only performed without control at steps 114, 117 and 118, the characteristics of the respective apparatuses in the vapor depositing machine are reflected in the measured values. Therefore, if the measured values are analyzed, the abnormal portions of the apparatuses can be found and identified early.

This example is concerned with the measurement and control of the positions of the vapor deposited zones and the vapor nondeposited zones on a film to have a metal vapor deposited in a vapor depositing machine, but the present invention is not limited thereto or thereby, and can also be applied to the inspection in the step of slitting downstream of the step of vapor deposition.

Figure 12:
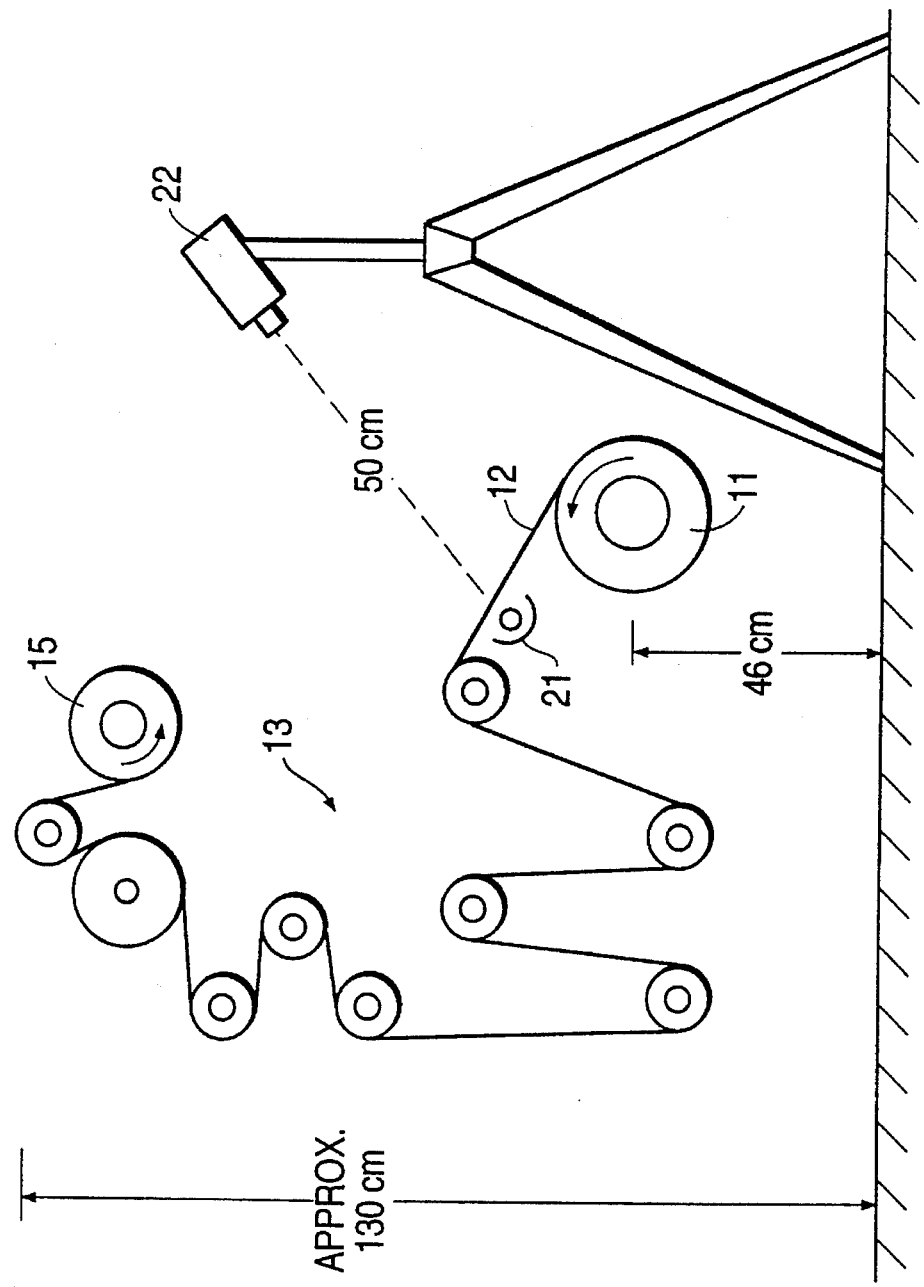
FIG. 12 is a schematic drawing showing an application of the present invention to the inspection in the step of slitting.

FIG. 12 is a schematic drawing showing a case of inspection in the step of slitting. The differences in the drawing from the above example are that data measurement only is performed, the distance between the face of the vapor deposited film 12 and the CCD elements of the line sensor camera 22 is 500 mm, the measurement resolution is 0.116 mm and the measurement field of view is 237 mm. Furthermore, in this particular example, the vapor deposited film did not have heavy edges, and the film set on a film unwinder 11 is carried at 200 m/min by a film carrier system 13, being wound by a winder 15. In this operation, measurement is performed 8192 times during the travel length of 200 m, and so the measurement intervals are 200/8192 m.

Figure 13:
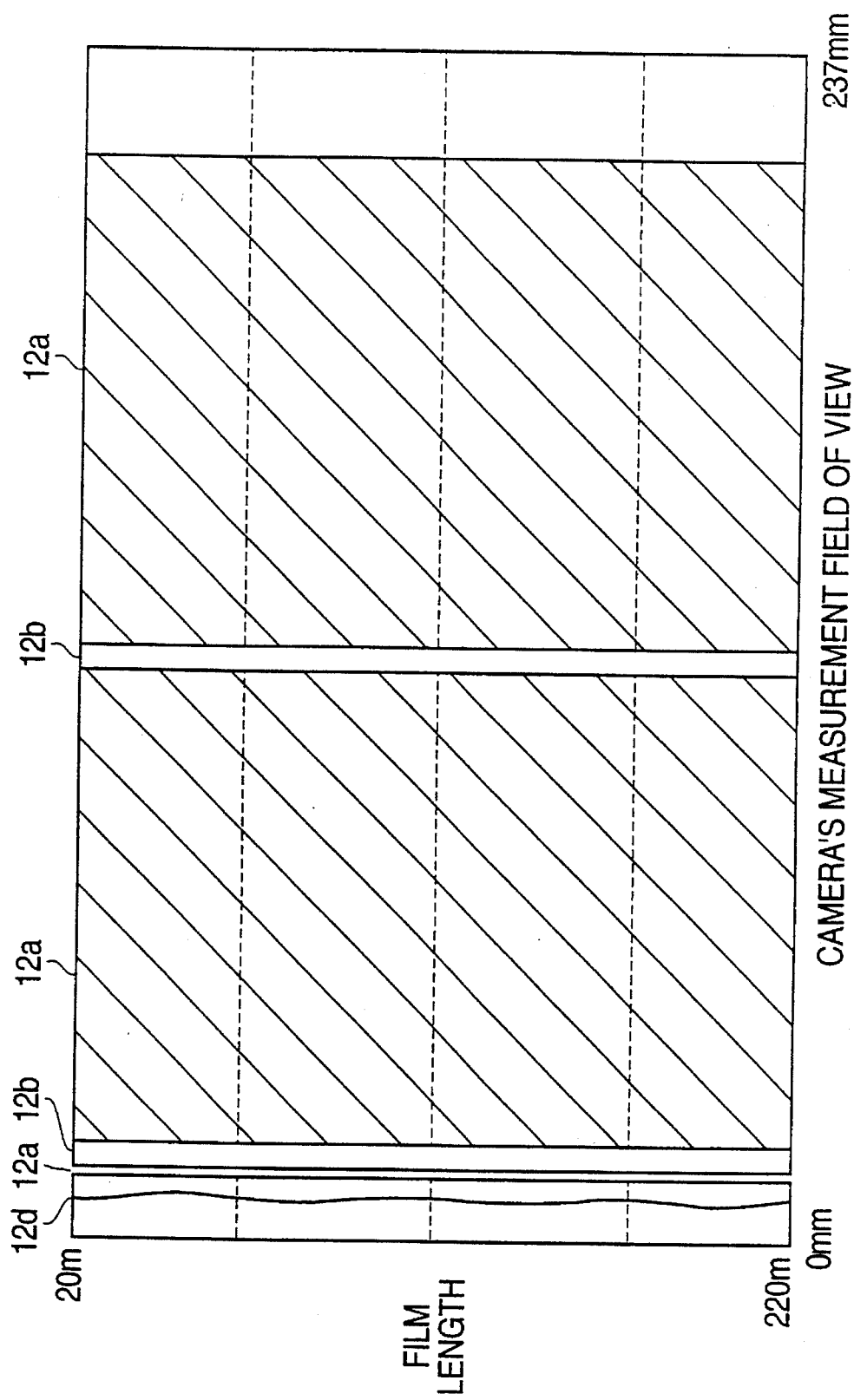
FIG. 13 is a drawing showing the results of measurement by the line sensor camera shown in FIG. 12.
Figure 14:
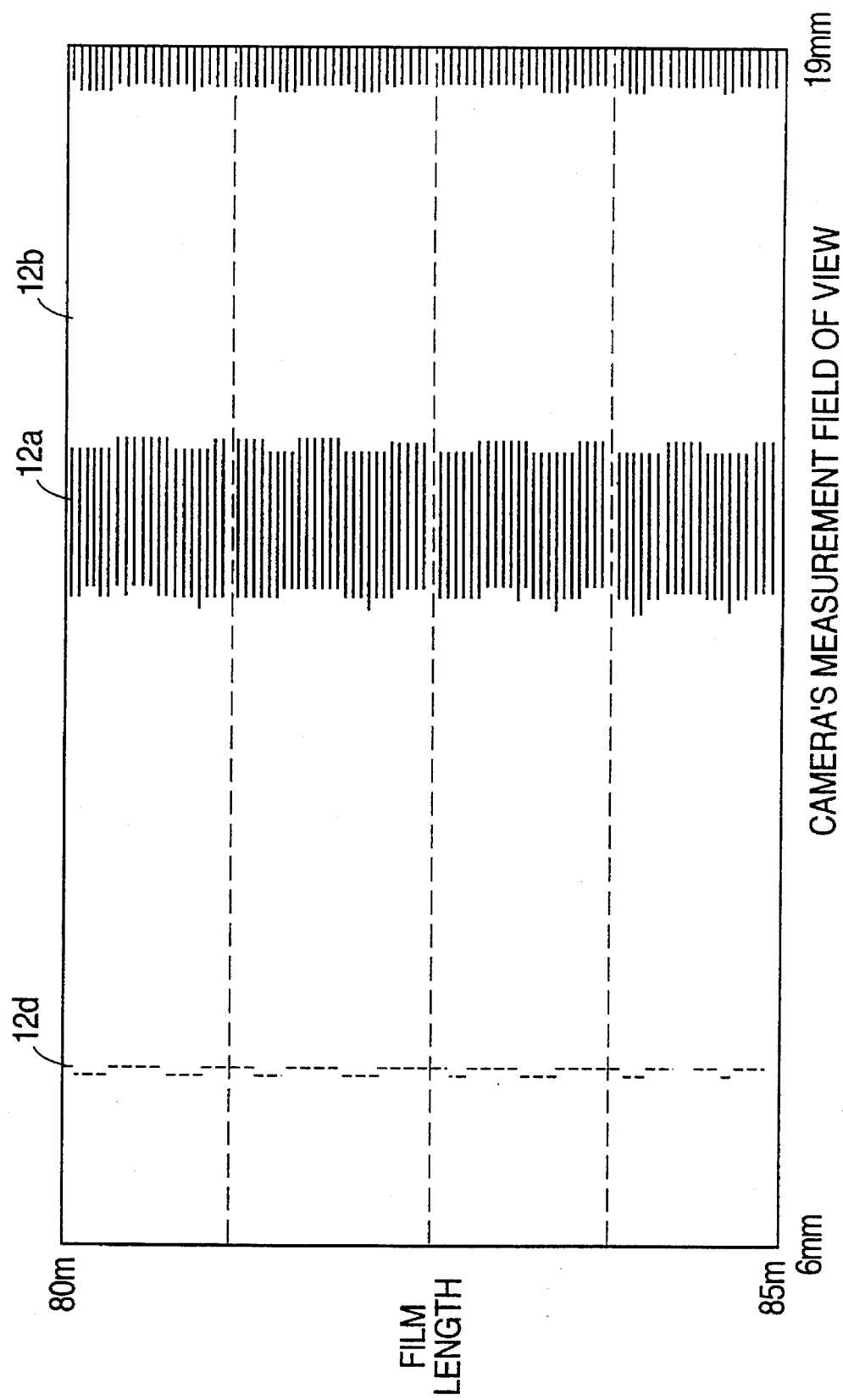
FIG. 14 is an expanded view showing a partially expanded portion of FIG. 13.
Figure 15:
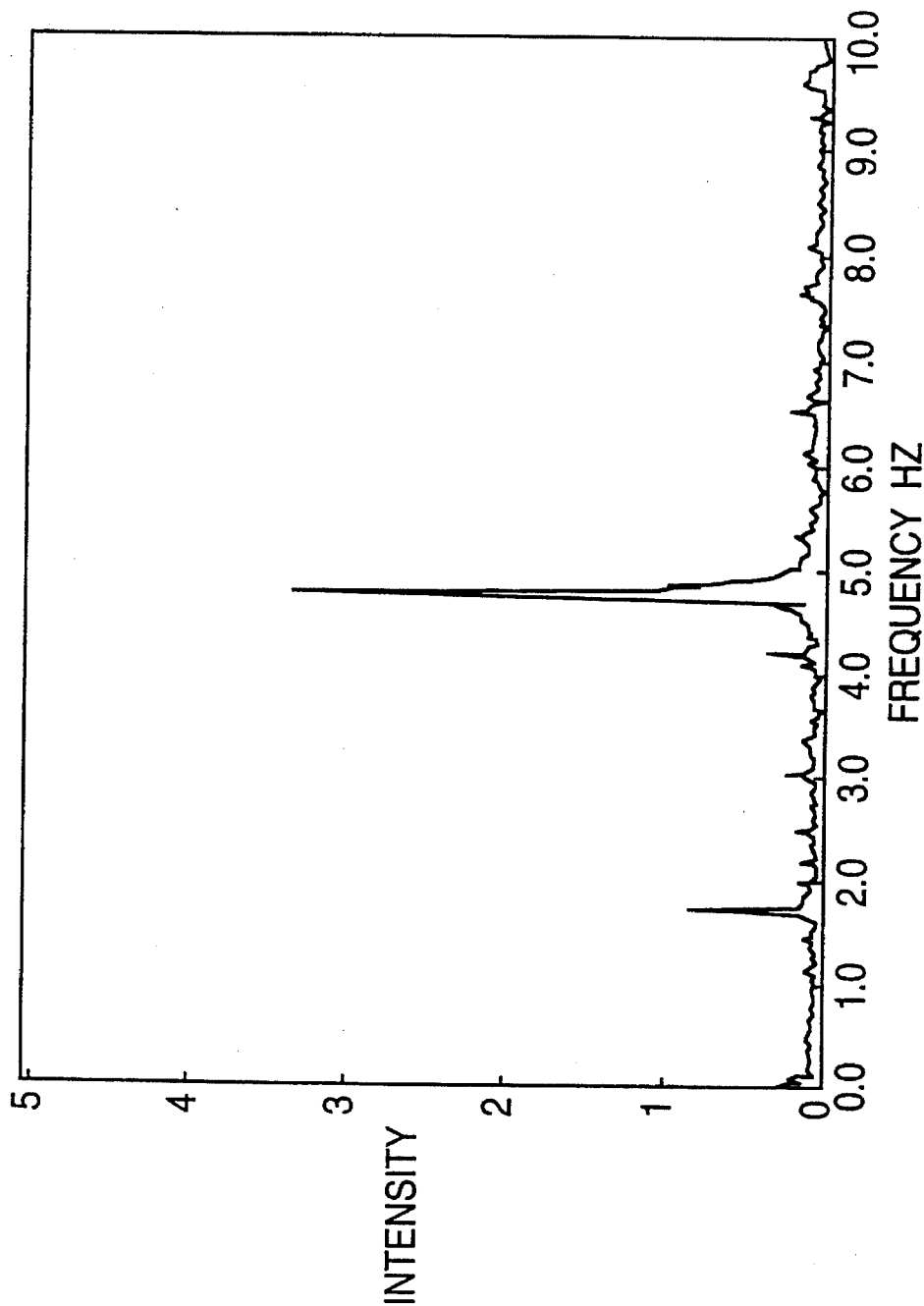
FIG. 15 is a diagram showing the results of Fourier analysis on a change point from a vapor deposited zone to a margin zone shown in FIG. 13.

FIG. 13 shows the results of measurement by the line sensor camera 22. In the drawing, symbol 12a denotes a vapor deposited zone; 12b, a margin zone; and 12d, the left edge of the film. In this case, since the resolution consists of 8192 scanning lines in the film longitudinal direction and 2048 pixels in the film transversal direction (camera's measurement field of view), part of FIG. 13 can also be expanded as shown in FIG. 14, for detailed observation. This view indicates that the left edge 12d of the film and the change points between the vapor deposited zones 12a and the margin zones 12b fluctuate in cycles of about 0.7 m. The Fourier analysis of the change points from the vapor deposited zones 12a to the margin zones 12b produces the diagram shown in FIG. 15. In FIG. 15, frequency components of 1.7 Hz and 4.8 Hz are detected, and from these values and the film traveling speed of 200 m/min., it can be seen that the change points fluctuate in position in cycles of 1.96 m and 0.69 m. This suggests that the vapor depositing machine or slitter has no trouble at the portions corresponding to the cycles.

Apart from the Fourier analysis, statistical analysis produces the results shown in Tables 1 to 3.

Table 1 shows the results of analysis at the points detected by the line sensor camera.

Table 2 shows the results of analysis on the distances from a film edge.

Table 3 shows the results of analysis on the widths of the vapor deposited zones, the widths of the margin zones and the vapor deposited length L.

Therefore, in this example, these values can be used as inspection data of the vapor deposited films.

The geometry measuring method, production process control method, production method, geometry measuring apparatus and production process control apparatus for a vapor deposited film of the present invention can be advantageously used for the production of a vapor deposited film with vapor deposited zones and vapor

TABLE 1

Analysis of points (absolute values) detected by line sensor camera

| Item | No. | Mean value (mm) | Min. value (mm) | Max. value (mm) | Standard deviation |
|---|---|---|---|---|---|
| Film edge | : | 8.44 | 7.75 | 9.13 | 0.48 |
| Margin zone | 1: | 13.17 | 12.83 | 13.53 | 0.09 |
|  | 2: | 18.61 | 18.38 | 18.73 | 0.07 |
| →Vapor deposited zone | 3: | 119.14 | 118.96 | 119.31 | 0.06 |
| Vapor deposited zone→ | 1: | 14.75 | 14.57 | 14.91 | 0.07 |
|  | 2: | 115.22 | 115.15 | 115.38 | 0.07 |
| Margin zone | 3: | 216.58 | 216.42 | 216.77 | 0.08 | nondeposited zones formed in stripes in the longitudinal direction and alternately in the transversal direction such as a metal vapor deposited film for capacitors.

Furthermore, the vapor deposited film of the present invention is highly accurate in the dimensions and positions of the vapor deposited zones and the vapor nondeposited zones, and also the ridges if present. Therefore, if it is used as a film for capacitors, the capacitors obtained are less varied in electrostatic capacity and high in reliability.

TABLE 2

Analysis of distances from film edge

| Item | No. | Mean value (mm) | Min. value (mm) | Max. value (mm) | Standard deviation |
|---|---|---|---|---|---|
| Margin zone | 1: | 4.73 | 3.93 | 5.55 | 0.47 |
|  | 2: | 10.17 | 9.48 | 10.87 | 0.48 |
| → Vapor deposited zone | 3: | 110.70 | 109.95 | 111.45 | 0.47 |
| Vapor deposited zone→ | 1: | 6.31 | 5.66 | 6.94 | 0.47 |
|  | 2: | 106.78 | 106.13 | 107.52 | 0.47 |
| Margin zone | 3: | 208.14 | 207.41 | 208.91 | 0.47 |

TABLE 3

Analysis of vapor deposited zone widths, margin zone widths and L

| Item | No. | Mean value (mm) | Min. value (mm) | Max. value (mm) | Standard deviation |
|---|---|---|---|---|---|
| Vapor | 1: | 1.58 | 1.16 | 1.73 | 0.08 |
| deposited | 2: | 96.61 | 96.53 | 96.77 | 0.06 |
| zone | 3: | 97.44 | 97.34 | 97.58 | 0.06 |
| Margin | 1: | 3.87 | 3.82 | 3.93 | 0.06 |
| zone | 2: | 3.91 | 3.82 | 3.93 | 0.04 |
| L | : | 100.53 | 100.47 | 100.70 | 0.06 |

What is claimed is:

1. A method for measuring the geometry of a vapor deposited film, comprising the steps of allowing a vapor deposited strip film comprising vapor deposited zones and vapor nondeposited zones formed in stripes in the longitudinal direction and alternately in the transversal direction to travel, while illuminating the vapor deposited film with light; receiving the light transmitted through said vapor deposited film; detecting the light transmittance distribution in the transversal direction of the vapor deposited film from the transmitted light; and determining the edge positions of said vapor deposited film, and the positions and widths of said vapor deposited zones and said vapor nondeposited zones based on the detected light transmittance distribution.

2. A method for measuring the geometry of a vapor deposited film, comprising the steps of allowing a vapor deposited strip film with vapor deposited zones, each with a longitudinal ridge, and vapor nondeposited zones formed in stripes in the longitudinal direction and alternately in the transversal direction to travel, while illuminating the vapor deposited film with light; receiving the light transmitted through the vapor deposited film; detecting the light transmittance distribution in the transversal direction of the vapor deposited film from the transmitted light; and determining the edge positions of the vapor deposited film, the positions and widths of the vapor deposited zones and the vapor nondeposited zones, and the positions of the ridges based on the detected light transmittance distribution.

3. The method for measuring the geometry of a vapor deposited film, according to claim 1 or 2, wherein the measurement is performed for every specified length of the vapor deposited film.

4. The method for measuring the geometry of a vapor deposited film, according to claim 1 or 2, wherein two threshold levels are set for the light transmittance distribution, to determine the edge positions of the vapor deposited film and the positions and the widths of the vapor deposited zones and the vapor nondeposited zones.

5. The method for measuring the geometry of a vapor deposited film, according to claim 2, wherein after determining the positions of the ridges, the transmitted light quantity received is set at 5 to 100 times that used for determining the edge positions and the positions and widths of the vapor deposited zones and the vapor nondeposited zones.

6. The method for measuring the geometry of a vapor deposited film, according to claim 2, wherein the determined positions and widths are calibrated based on a correlation between a change in the detected light transmittance distribution and the nominal forming intervals of the vapor nondeposited zones.

7. A method for controlling the production process of a vapor deposited film, comprising the steps of forming vapor deposited zones and vapor nondeposited zones in stripes in a longitudinal direction and alternately in the transversal direction on a traveling strip film while illuminating the vapor deposited film with light; receiving the light transmitted through the vapor deposited film; detecting the light transmittance distribution in the transversal direction of the vapor deposited film from the transmitted light; determining the edge positions of the vapor deposited film, and the positions and widths of the vapor deposited zones and the vapor nondeposited zones based on the detected light transmittance distribution; controlling the film position in the transversal direction in correspondence with the determined edge positions; and controlling the positions and widths of the vapor deposited zones and the vapor nondeposited zones in correspondence with the determined positions and widths of the vapor deposited zones and the vapor nondeposited zones.

8. A method for controlling the production process of a vapor deposited film, comprising the steps of forming vapor deposited zones, each with a longitudinal ridge, and vapor nondeposited zones in stripes in the longitudinal direction and alternately in the transversal direction on a traveling strip film while illuminating the vapor deposited film with light; receiving the light transmitted through the vapor deposited film; detecting the light transmittance distribution in the transversal direction of the vapor deposited film from the transmitted light; determining the edge positions of the vapor deposited film, the positions and widths of the vapor deposited zones and the vapor nondeposited zones, and the positions of the ridges based on the detected light transmittance distribution; controlling the film position in the transversal direction in correspondence with the determined edge positions; controlling the positions and widths of the vapor deposited zones and the vapor nondeposited zones in correspondence with the determined positions and widths of the vapor deposited zones and the vapor nondeposited zones; and controlling the positions of the ridges in correspondence with the determined positions of the ridges.

9. An apparatus for measuring the geometry of a vapor deposited film, comprising a light source for emitting light to a traveling vapor deposited strip film with vapor deposited zones and vapor nondeposited zones formed in stripes in the longitudinal direction and alternately in the transversal direction; a means for receiving the light transmitted through the vapor deposited film; a means for detecting the light transmittance distribution of the vapor deposited film in the transversal direction from the transmitted light; and a means for calculating the edge positions and the positions and widths of the vapor deposited zones and the vapor nondeposited zones based on the detected light transmittance distribution.

10. An apparatus for measuring the geometry on a vapor deposited film, comprising a light source for emitting light to a traveling vapor deposited strip film with vapor deposited zones, each with a longitudinal ridge, and vapor nondeposited zones formed in stripes in the longitudinal direction and alternately in the transversal direction; a means for receiving the light transmitted through the vapor deposited film; a means for detecting the light transmittance distribution of the vapor deposited film in the transversal direction from the transmitted light; and a means for calculating the edge positions, the positions and widths of the vapor deposited zones and the vapor nondeposited zones, and the positions of the ridges based on the detected light transmittance distribution.

11. An apparatus for controlling the production process of a vapor deposited film, comprising a carrier means for allowing a strip film with vapor deposited zones and vapor nondeposited zones formed in stripes in the longitudinal direction and alternately in the transversal direction to travel continuously; a means for forming the vapor deposited zones; a means for forming the vapor nondeposited zones; a light source for emitting light to the film; a means for receiving the light transmitted through the film; a means for detecting the light transmittance distribution of the film in the transversal direction from the transmitted light; a means for calculating the edge positions of the film, and the positions and widths of the vapor deposited zones and the vapor nondeposited zones based on the detected light transmittance distribution; a first control means for controlling the carrier means in correspondence with the calculated edge positions; and a second control means for controlling the vapor nondeposited zone forming means in correspondence with the calculated positions and widths of the vapor deposited zones and the vapor nondeposited zones.

12. An apparatus for controlling the production process of a vapor deposited film, comprising a carrier means for allowing a strip film with vapor deposited zones, each with a longitudinal ridge, and vapor nondeposited zones formed in stripes in the longitudinal direction and alternately in the transversal direction to travel continuously; a means for forming the vapor deposited zones; a means for forming the vapor nondeposited zones; a light source for emitting light to the film; a means for receiving the light transmitted through the film; a means for detecting the light transmittance distribution of the film in the transversal direction from the transmitted light; a means for calculating the edge positions of the film, the positions and widths of the vapor deposited zones and the vapor nondeposited zones, and the positions of the ridges based on the detected light transmittance distribution; a first control means for controlling the carrier means in correspondence with the calculated edge positions; a second control means for controlling the vapor nondeposited zone forming means corresponding to the calculated positions and widths of the vapor deposited zones and the vapor nondeposited zones; and a third control means for controlling the vapor deposited zone forming means in correspondence with the calculated positions of the ridges.

13. A method for producing a vapor deposited film, comprising the steps of allowing a film to travel while forming vapor deposited zones and vapor nondeposited zones on the film in stripes in the longitudinal direction of the film and alternately in the transversal direction; detecting the light transmittance distribution of the film in the transversal direction; determining the edge positions of the film, and the positions and widths of the vapor deposited zones and the vapor nondeposited zones based on the detected light transmittance distribution; and controlling the vapor deposited zones and the vapor nondeposited zones at predetermined positions on the film in correspondence with the determined edge positions and the determined positions and widths of the vapor deposited zones and the vapor nondeposited zones.

* * * * *